(12) United States Patent
Verma et al.

(10) Patent No.: US 7,689,966 B2
(45) Date of Patent: Mar. 30, 2010

(54) METHODS, SYSTEMS, AND CARRIER MEDIA FOR EVALUATING RETICLE LAYOUT DATA

(75) Inventors: Gaurav Verma, Sunnyvale, CA (US);
Lance Glasser, Saratoga, CA (US);
Moshe E. Preil, Sunnyvale, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 169 days.

(21) Appl. No.: 11/226,698

(22) Filed: Sep. 14, 2005
(Under 37 CFR 1.47)

(65) Prior Publication Data
US 2006/0062445 A1 Mar. 23, 2006

Related U.S. Application Data

(60) Provisional application No. 60/609,670, filed on Sep. 14, 2004.

(51) Int. Cl.
*G06F 17/50* (2006.01)
(52) U.S. Cl. ........................................ 716/19
(58) Field of Classification Search .................. 716/21; 250/491.1, 492.22
See application file for complete search history.

(56) References Cited

U.S. PATENT DOCUMENTS

| | | | |
|---|---|---|---|
| 3,495,269 A | 2/1970 | Mutschler et al. |
| 3,496,352 A | 2/1970 | Jugle |
| 3,909,602 A | 9/1975 | Micka |
| 4,015,203 A | 3/1977 | Verkuil |
| 4,247,203 A | 1/1981 | Levy et al. |
| 4,347,001 A | 8/1982 | Levy et al. |
| 4,378,159 A | 3/1983 | Galbraith |
| 4,448,532 A | 5/1984 | Joseph et al. |
| 4,532,650 A | 7/1985 | Wihl et al. |

(Continued)

FOREIGN PATENT DOCUMENTS

EP 0032197 7/1981

(Continued)

OTHER PUBLICATIONS

U.S. Appl. No. 60/418,994, filed Oct. 15, 2002, Stokowski.

(Continued)

*Primary Examiner*—Vuthe Siek
*Assistant Examiner*—Aric Lin
(74) *Attorney, Agent, or Firm*—Ann Marie Mewherter

(57) ABSTRACT

Various computer-implemented methods are provided. One method for evaluating reticle layout data includes generating a simulated image using the reticle layout data as input to a model of a reticle manufacturing process. The simulated image illustrates how features of the reticle layout data will be formed on a reticle by the reticle manufacturing process. The method also includes determining manufacturability of the reticle layout data using the simulated image. The manufacturability is a measure of how accurately the features will be formed on the reticle. Also provided are various carrier media that include program instructions executable on a computer system for performing a method for evaluating reticle layout data as described herein. In addition, systems configured to evaluate reticle layout data are provided. The systems include a computer system and a carrier medium that includes program instructions executable on the computer system for performing method(s) described herein.

31 Claims, 6 Drawing Sheets

U.S. PATENT DOCUMENTS

| | | | |
|---|---|---|---|
| 4,555,798 A | 11/1985 | Broadbent, Jr. et al. |
| 4,578,810 A | 3/1986 | MacFarlane et al. |
| 4,579,455 A | 4/1986 | Levy et al. |
| 4,595,289 A | 6/1986 | Feldman et al. |
| 4,599,558 A | 7/1986 | Castellano et al. |
| 4,633,504 A | 12/1986 | Wihl |
| 4,641,353 A | 2/1987 | Kobayashi |
| 4,641,967 A | 2/1987 | Pecen |
| 4,734,721 A | 3/1988 | Boyer et al. |
| 4,758,094 A | 7/1988 | Wihl |
| 4,766,324 A | 8/1988 | Saadat et al. |
| 4,799,175 A | 1/1989 | Sano et al. |
| 4,805,123 A | 2/1989 | Specht et al. |
| 4,812,756 A | 3/1989 | Curtis et al. |
| 4,814,829 A | 3/1989 | Kosugi et al. |
| 4,817,123 A | 3/1989 | Sones et al. |
| 4,845,558 A | 7/1989 | Tsai et al. |
| 4,877,326 A | 10/1989 | Chadwick et al. |
| 4,926,489 A | 5/1990 | Danielson et al. |
| 4,928,313 A | 5/1990 | Leonard et al. |
| 5,046,109 A | 9/1991 | Fujimori et al. |
| 5,189,481 A | 2/1993 | Jann et al. |
| 5,444,480 A | 8/1995 | Sumita |
| 5,453,844 A | 9/1995 | George et al. |
| 5,459,520 A | 10/1995 | Sasaki |
| 5,481,624 A | 1/1996 | Kamon |
| 5,485,091 A | 1/1996 | Verkuil |
| 5,528,153 A | 6/1996 | Taylor et al. |
| 5,544,256 A | 8/1996 | Brecher et al. |
| 5,563,702 A | 10/1996 | Emery et al. |
| 5,572,598 A | 11/1996 | Wihl et al. |
| 5,578,821 A | 11/1996 | Meisberger et al. |
| 5,594,247 A | 1/1997 | Verkuil et al. |
| 5,608,538 A | 3/1997 | Edgar et al. |
| 5,619,548 A | 4/1997 | Koppel |
| 5,621,519 A | 4/1997 | Frost et al. |
| 5,644,223 A | 7/1997 | Verkuil |
| 5,650,731 A | 7/1997 | Fung |
| 5,661,408 A | 8/1997 | Kamieniecki et al. |
| 5,689,614 A | 11/1997 | Gronet et al. |
| 5,694,478 A | 12/1997 | Braier et al. |
| 5,696,835 A | 12/1997 | Hennessey et al. |
| 5,703,969 A | 12/1997 | Hennessey et al. |
| 5,737,072 A | 4/1998 | Emery et al. |
| 5,742,658 A | 4/1998 | Tiffin et al. |
| 5,754,678 A | 5/1998 | Hawthorne et al. |
| 5,767,691 A | 6/1998 | Verkuil |
| 5,767,693 A | 6/1998 | Verkuil |
| 5,771,317 A | 6/1998 | Edgar |
| 5,773,989 A | 6/1998 | Edelman et al. |
| 5,774,179 A | 6/1998 | Chevrette et al. |
| 5,795,685 A | 8/1998 | Liebmann et al. |
| 5,834,941 A | 11/1998 | Verkuil |
| 5,852,232 A | 12/1998 | Samsavar et al. |
| 5,866,806 A | 2/1999 | Samsavar et al. |
| 5,874,733 A | 2/1999 | Silver et al. |
| 5,884,242 A | 3/1999 | Meier et al. |
| 5,889,593 A | 3/1999 | Bareket |
| 5,932,377 A | 8/1999 | Ferguson et al. |
| 5,940,458 A | 8/1999 | Suk |
| 5,948,972 A | 9/1999 | Samsavar et al. |
| 5,955,661 A | 9/1999 | Samsavar et al. |
| 5,965,306 A | 10/1999 | Mansfield et al. |
| 5,980,187 A | 11/1999 | Verhovsky |
| 5,986,263 A | 11/1999 | Hiroi et al. |
| 5,991,699 A | 11/1999 | Kulkarni et al. |
| 6,011,404 A | 1/2000 | Ma et al. |
| 6,014,461 A | 1/2000 | Hennessey et al. |
| 6,052,478 A | 4/2000 | Wihl et al. |
| 6,060,709 A | 5/2000 | Verkuil et al. |
| 6,072,320 A | 6/2000 | Verkuil |
| 6,076,465 A | 6/2000 | Vacca et al. |
| 6,078,738 A | 6/2000 | Garza et al. |
| 6,091,257 A | 7/2000 | Verkuil et al. |
| 6,091,846 A | 7/2000 | Lin et al. |
| 6,097,196 A | 8/2000 | Verkuil et al. |
| 6,097,887 A | 8/2000 | Hardikar et al. |
| 6,104,206 A | 8/2000 | Verkuil |
| 6,104,835 A | 8/2000 | Han |
| 6,121,783 A | 9/2000 | Horner et al. |
| 6,122,017 A | 9/2000 | Taubman |
| 6,122,046 A | 9/2000 | Almogy |
| 6,137,570 A | 10/2000 | Chuang et al. |
| 6,141,038 A | 10/2000 | Young et al. |
| 6,146,627 A | 11/2000 | Muller |
| 6,171,737 B1 | 1/2001 | Phan et al. |
| 6,175,645 B1 | 1/2001 | Elyasaf et al. |
| 6,184,929 B1 | 2/2001 | Noda et al. |
| 6,184,976 B1 | 2/2001 | Park et al. |
| 6,191,605 B1 | 2/2001 | Miller et al. |
| 6,201,999 B1 | 3/2001 | Jevtic |
| 6,202,029 B1 | 3/2001 | Verkuil et al. |
| 6,205,239 B1 | 3/2001 | Lin et al. |
| 6,224,638 B1 | 5/2001 | Jevtic et al. |
| 6,233,719 B1 | 5/2001 | Hardikar et al. |
| 6,248,485 B1 | 6/2001 | Cuthbert |
| 6,248,486 B1 | 6/2001 | Dirksen et al. |
| 6,259,960 B1 | 7/2001 | Inokuchi |
| 6,266,437 B1 | 7/2001 | Elchel et al. |
| 6,267,005 B1 | 7/2001 | Samsavar et al. |
| 6,268,093 B1 | 7/2001 | Kenan et al. |
| 6,272,236 B1 | 8/2001 | Pierrat et al. |
| 6,282,309 B1 | 8/2001 | Emery |
| 6,292,582 B1 | 9/2001 | Lin et al. |
| 6,324,298 B1 | 11/2001 | O'Dell et al. |
| 6,344,640 B1 | 2/2002 | Rhoads |
| 6,363,166 B1 | 3/2002 | Wihl et al. |
| 6,373,975 B1 | 4/2002 | Bula et al. |
| 6,415,421 B2 * | 7/2002 | Anderson et al. ............... 716/4 |
| 6,445,199 B1 | 9/2002 | Satya et al. |
| 6,451,690 B1 | 9/2002 | Matsumoto |
| 6,466,314 B1 | 10/2002 | Lehman |
| 6,466,315 B1 | 10/2002 | Karpol et al. |
| 6,470,489 B1 | 10/2002 | Chang et al. |
| 6,483,938 B1 | 11/2002 | Hennessey et al. |
| 6,513,151 B1 | 1/2003 | Erhardt et al. |
| 6,526,164 B1 | 2/2003 | Mansfield et al. |
| 6,529,621 B1 | 3/2003 | Glasser et al. |
| 6,535,628 B2 | 3/2003 | Smargiassi et al. |
| 6,539,106 B1 | 3/2003 | Gallarda et al. |
| 6,569,691 B1 | 5/2003 | Jastrzebski et al. |
| 6,581,193 B1 | 6/2003 | McGhee et al. |
| 6,593,748 B1 | 7/2003 | Halliyal et al. |
| 6,597,193 B2 | 7/2003 | Lagowski et al. |
| 6,602,728 B1 | 8/2003 | Liebmann et al. |
| 6,608,681 B2 | 8/2003 | Tanaka et al. |
| 6,614,520 B1 | 9/2003 | Bareket et al. |
| 6,636,301 B1 | 10/2003 | Kvamme et al. |
| 6,642,066 B1 | 11/2003 | Halliyal et al. |
| 6,658,640 B2 | 12/2003 | Weed |
| 6,665,065 B1 | 12/2003 | Phan et al. |
| 6,670,082 B2 | 12/2003 | Liu et al. |
| 6,680,621 B2 | 1/2004 | Savtchouk et al. |
| 6,691,052 B1 | 2/2004 | Maurer |
| 6,701,004 B1 | 3/2004 | Shykind et al. |
| 6,718,526 B1 | 4/2004 | Eldredge et al. |
| 6,721,695 B1 * | 4/2004 | Chen et al. ..................... 703/7 |
| 6,734,696 B2 | 5/2004 | Horner et al. |
| 6,748,103 B2 | 6/2004 | Glasser |
| 6,751,519 B1 | 6/2004 | Satya et al. |
| 6,753,954 B2 | 6/2004 | Chen |
| 6,757,645 B2 * | 6/2004 | Chang et al. .................. 703/13 |
| 6,771,806 B1 | 8/2004 | Satya et al. |
| 6,775,818 B2 | 8/2004 | Taravade et al. |

| | | | | | | |
|---|---|---|---|---|---|---|
| 6,777,147 B1 | 8/2004 | Fonseca et al. | | 2002/0088951 A1 | 7/2002 | Chen |
| 6,777,676 B1 | 8/2004 | Wang et al. | | 2002/0090746 A1 | 7/2002 | Xu et al. |
| 6,778,695 B1 | 8/2004 | Schellenberg et al. | | 2002/0134936 A1 | 9/2002 | Matsui et al. |
| 6,779,159 B2 | 8/2004 | Yokoyama et al. | | 2002/0144230 A1 | 10/2002 | Rittman |
| 6,784,446 B1 | 8/2004 | Phan et al. | | 2002/0164065 A1 | 11/2002 | Cai et al. |
| 6,788,400 B2 | 9/2004 | Chen | | 2002/0181756 A1 | 12/2002 | Shibuya et al. |
| 6,789,032 B2 | 9/2004 | Barbour et al. | | 2002/0186878 A1 | 12/2002 | Hoon et al. |
| 6,803,554 B2 | 10/2004 | Ye et al. | | 2002/0192578 A1 | 12/2002 | Tanaka et al. |
| 6,806,456 B2 | 10/2004 | Ye et al. | | 2003/0014146 A1 | 1/2003 | Fujii |
| 6,807,503 B2 | 10/2004 | Ye et al. | | 2003/0022401 A1 | 1/2003 | Hamamatsu et al. |
| 6,813,572 B2 | 11/2004 | Satya et al. | | 2003/0033046 A1 | 2/2003 | Yoshitake et al. |
| 6,820,028 B2 | 11/2004 | Ye et al. | | 2003/0048458 A1 | 3/2003 | Mieher |
| 6,828,542 B2 | 12/2004 | Ye et al. | | 2003/0048939 A1 | 3/2003 | Lehman |
| 6,842,225 B1 | 1/2005 | Irie | | 2003/0057971 A1 | 3/2003 | Nishiyama et al. |
| 6,859,746 B1 | 2/2005 | Stirton | | 2003/0086081 A1 | 5/2003 | Lehman |
| 6,879,924 B2 | 4/2005 | Ye et al. | | 2003/0098805 A1 | 5/2003 | Bizjak |
| 6,882,745 B2 | 4/2005 | Brankner | | 2003/0128870 A1 | 7/2003 | Pease et al. |
| 6,884,984 B2 | 4/2005 | Ye et al. | | 2003/0138138 A1 | 7/2003 | Vacca et al. |
| 6,886,153 B1 | 4/2005 | Bevis | | 2003/0138978 A1 | 7/2003 | Tanaka et al. |
| 6,892,156 B2 | 5/2005 | Ye et al. | | 2003/0169916 A1 | 9/2003 | Hayashi et al. |
| 6,902,855 B2 | 6/2005 | Peterson et al. | | 2003/0192015 A1 | 10/2003 | Liu |
| 6,906,305 B2 | 6/2005 | Pease et al. | | 2003/0207475 A1 | 11/2003 | Nakasuji et al. |
| 6,918,101 B1 | 7/2005 | Satya et al. | | 2003/0223639 A1 | 12/2003 | Shlain et al. |
| 6,948,141 B1 | 9/2005 | Satya et al. | | 2003/0226951 A1 | 12/2003 | Ye et al. |
| 6,959,255 B2 | 10/2005 | Ye et al. | | 2003/0228714 A1 | 12/2003 | Smith |
| 6,966,047 B1 | 11/2005 | Glasser | | 2003/0229410 A1 | 12/2003 | Smith et al. |
| 6,969,837 B2 | 11/2005 | Ye et al. | | 2003/0229412 A1 | 12/2003 | White |
| 6,969,864 B2 | 11/2005 | Ye et al. | | 2003/0229868 A1 | 12/2003 | White |
| 6,983,060 B1 | 1/2006 | Martinent-Catalot et al. | | 2003/0229875 A1 | 12/2003 | Smith |
| 6,988,045 B2 | 1/2006 | Purdy | | 2003/0229880 A1 | 12/2003 | White |
| 7,003,755 B2 | 2/2006 | Pang et al. | | 2003/0229881 A1 | 12/2003 | White |
| 7,003,758 B2 | 2/2006 | Ye et al. | | 2003/0237064 A1 | 12/2003 | White et al. |
| 7,012,438 B1 | 3/2006 | Miller et al. | | 2004/0030430 A1 | 2/2004 | Matsuoka |
| 7,026,615 B2 | 4/2006 | Takane et al. | | 2004/0032908 A1 | 2/2004 | Hagai et al. |
| 7,027,143 B1 | 4/2006 | Stokowski et al. | | 2004/0052411 A1 | 3/2004 | Qian et al. |
| 7,030,966 B2 | 4/2006 | Hansen | | 2004/0057611 A1 | 3/2004 | Lee et al. |
| 7,030,997 B2 | 4/2006 | Neureuther et al. | | 2004/0091142 A1 | 5/2004 | Peterson et al. |
| 7,053,355 B2 | 5/2006 | Ye et al. | | 2004/0098216 A1 | 5/2004 | Ye et al. |
| 7,061,625 B1 | 6/2006 | Hwang | | 2004/0102934 A1 | 5/2004 | Chang |
| 7,103,484 B1 | 9/2006 | Shi et al. | | 2004/0107412 A1* | 6/2004 | Pack et al. ............ 716/19 |
| 7,106,895 B1 | 9/2006 | Goldberg et al. | | 2004/0119036 A1 | 6/2004 | Ye et al. |
| 7,107,517 B1 | 9/2006 | Suzuki et al. | | 2004/0133369 A1 | 7/2004 | Pack et al. |
| 7,107,571 B2 | 9/2006 | Chang et al. | | 2004/0174506 A1 | 9/2004 | Smith |
| 7,111,277 B2 | 9/2006 | Ye et al. | | 2004/0223639 A1 | 11/2004 | Sato |
| 7,114,145 B2 | 9/2006 | Ye et al. | | 2004/0228515 A1 | 11/2004 | Okabe et al. |
| 7,117,477 B2 | 10/2006 | Ye et al. | | 2004/0243320 A1 | 12/2004 | Chang et al. |
| 7,117,478 B2 | 10/2006 | Ye et al. | | 2005/0004774 A1 | 1/2005 | Volk et al. |
| 7,120,895 B2 | 10/2006 | Ye et al. | | 2005/0008218 A1 | 1/2005 | O'Dell et al. |
| 7,124,386 B2 | 10/2006 | Smith | | 2005/0010890 A1 | 1/2005 | Nehmadi et al. |
| 7,135,344 B2* | 11/2006 | Nehmadi et al. ........ 438/14 | | 2005/0062962 A1 | 3/2005 | Fairley |
| 7,136,143 B2 | 11/2006 | Smith | | 2005/0117796 A1 | 6/2005 | Matsui et al. |
| 7,152,215 B2 | 12/2006 | Smith | | 2005/0132306 A1 | 6/2005 | Smith |
| 7,171,334 B2 | 1/2007 | Gassner | | 2005/0166174 A1 | 7/2005 | Ye et al. |
| 7,174,520 B2 | 2/2007 | White | | 2005/0190957 A1 | 9/2005 | Cai et al. |
| 7,194,709 B2 | 3/2007 | Brankner | | 2005/0198602 A1 | 9/2005 | Brankner |
| 7,207,017 B1 | 4/2007 | Tabery et al. | | 2006/0000964 A1 | 1/2006 | Ye et al. |
| 7,231,628 B2 | 6/2007 | Pack et al. | | 2006/0048089 A1 | 3/2006 | Schwarzband |
| 7,236,847 B2 | 6/2007 | Marella | | 2006/0051682 A1 | 3/2006 | Hess et al. |
| 7,379,175 B1 | 5/2008 | Stokowski et al. | | 2006/0082763 A1 | 4/2006 | The et al. |
| 7,386,839 B1 | 6/2008 | Golender et al. | | 2006/0159333 A1 | 7/2006 | Ishikawa |
| 7,418,124 B2 | 8/2008 | Peterson et al. | | 2006/0161452 A1 | 7/2006 | Hess |
| 7,424,145 B2 | 9/2008 | Horie et al. | | 2006/0193506 A1 | 8/2006 | Dorphan et al. |
| 7,120,285 B1 | 10/2009 | Spence | | 2006/0193507 A1 | 8/2006 | Sali et al. |
| 7,133,548 B2 | 11/2009 | Kenan et al. | | 2006/0236294 A1 | 10/2006 | Saidin |
| 2001/0019625 A1 | 9/2001 | Kenan et al. | | 2006/0236297 A1 | 10/2006 | Melvin et al. |
| 2001/0022858 A1 | 9/2001 | Komiya et al. | | 2006/0265145 A1 | 11/2006 | Huet et al. |
| 2001/0043735 A1 | 11/2001 | Smargiassi et al. | | 2006/0269120 A1 | 11/2006 | Nehmadi et al. |
| 2002/0019729 A1 | 2/2002 | Chang et al. | | 2006/0273242 A1 | 12/2006 | Hunsche et al. |
| 2002/0026626 A1* | 2/2002 | Randall et al. ............ 716/19 | | 2006/0273266 A1 | 12/2006 | Preil et al. |
| 2002/0033449 A1 | 3/2002 | Nakasuji et al. | | 2006/0291714 A1 | 12/2006 | Wu et al. |
| 2002/0035461 A1 | 3/2002 | Chang et al. | | 2006/0292463 A1 | 12/2006 | Best et al. |
| 2002/0035641 A1 | 3/2002 | Kurose | | 2007/0002322 A1 | 1/2007 | Borodovsky et al. |
| 2002/0083408 A1 | 6/2002 | Haffner et al. | | 2007/0019171 A1 | 1/2007 | Smith |

| | | | |
|---|---|---|---|
| 2007/0031745 A1 | 2/2007 | Ye et al. | |
| 2007/0032896 A1 | 2/2007 | Ye et al. | |
| 2007/0035712 A1 | 2/2007 | Gassner et al. | |
| 2007/0035728 A1 | 2/2007 | Kekare et al. | |
| 2007/0052963 A1 | 3/2007 | Orbon | |
| 2007/0064995 A1 | 3/2007 | Oaki et al. | |
| 2008/0049994 A1 | 2/2008 | Rognin et al. | |

FOREIGN PATENT DOCUMENTS

| | | |
|---|---|---|
| EP | 0370322 | 5/1990 |
| EP | 1061358 | 12/2000 |
| EP | 1061571 | 12/2000 |
| EP | 1065567 | 1/2001 |
| EP | 1066925 | 1/2001 |
| EP | 1069609 | 1/2001 |
| EP | 1093017 | 4/2001 |
| EP | 1480034 | 11/2004 |
| EP | 1696270 | 8/2006 |
| JP | 2002-071575 | 3/2002 |
| KR | 1020030055848 | 7/2003 |
| WO | WO 98/57358 | 12/1998 |
| WO | WO 99/22310 | 5/1999 |
| WO | WO 99/25004 | 5/1999 |
| WO | WO 99/38002 | 7/1999 |
| WO | WO 99/41434 | 8/1999 |
| WO | WO 99/59200 | 11/1999 |
| WO | WO 00/03234 | 1/2000 |
| WO | 00/36525 | 6/2000 |
| WO | WO 00/55799 | 9/2000 |
| WO | WO 00/68884 | 11/2000 |
| WO | WO 00/70332 | 11/2000 |
| WO | WO 01/09566 | 2/2001 |
| WO | WO 01/40145 | 6/2001 |
| WO | WO 03/104921 | 12/2003 |
| WO | WO 2004/027684 | 4/2004 |
| WO | WO 2006/063268 | 6/2006 |

OTHER PUBLICATIONS

U.S. Appl. No. 60/451,707, filed Mar. 4, 2003, Howard.
U.S. Appl. No. 60/738,290, filed Nov. 18, 2005, Kulkarni.
U.S. Appl. No. 60/609,670, filed Sep. 14, 2004, Preil.
U.S. Appl. No. 60/772,418, filed Feb. 9, 2006, Kirk et al.
U.S. Appl. No. 11/673,150, filed Feb. 9, 2007, Kirk et al.
U.S. Appl. No. 10/778,752, filed Feb. 13, 2004, Mack.
U.S. Appl. No. 10/679,617, filed Oct. 6, 2003, Stokowski.
U.S. Appl. No. 10/793,599, filed Mar. 4, 2004, Howard.
U.S. Appl. No. 11/300,172, filed Dec. 14, 2005, Lin.
U.S. Appl. No. 11/561,735, filed Nov. 20, 2006, Kulkarni et al.
U.S. Appl. No. 11/561,659, filed Nov. 20, 2006, Zafar et al.
U.S. Appl. No. 11/154,310, filed Jun. 16, 2005, Verma et al.
Volk et al., "Investigation of Smart Inspection of Critical Layer Reticles using Additional Designer Data to Determine Defect Significance," Proceedings of SPIE vol. 5256, 2003, pp. 489-499.
Mack, "Lithographic Simulation: A Review," Proceedings of SPIE vol. 4440, 2001, pp. 59-72.
Lo et al, "Identifying Process Window Marginalities of Reticle Designs for 0.15/0.13 μm Technologies," Proceedings of SPIE vol. 5130, 2003, pp. 829-837.
Dirksen et al., "Impact of high order aberrations on the performance of the aberration monitor," Proc. Of SPIE vol. 4000, Mar. 2000, pp. 9-17.
Dirksen et al., "Novel aberration monitor for optical lithography," Proc. Of SPIE vol. 3679, Jul. 1999, pp. 77-86.
U.S. Appl. No. 11/759.607, filed Jun. 2007, Kulkarni et al.
Allan et al, "Critical Area Extraction for Soft Fault Estimation," IEEE Transactions on Semiconductor Manufacturing, vol. 11, No. 1, Feb. 1998.
U.S. Appl. No. 11/837,208, filed Aug. 2007, Park.
U.S. Appl. No. 11/830,485, filed Jul. 2007, Kulkarni et al.
U.S. Appl. No. 11/950,961, filed Dec. 2007, Fouquet et al.
U.S. Appl. No. 12/102,343, filed Apr. 2008, Chen et al.

Svidenko et al. "Dynamic Defect-Limited Yield Prediction by Criticality Factor," ISSM Paper YE-O-157, 2007.
U.S. Appl. No. 11/960,157, filed Dec. 2007, Kulkarni et al.
U.S. Appl. No. 11/970,294, filed Jan. 2008, Park et al.
Lorusso et al. "Advanced DFM Applns. Using design-based metrology on CDSEM," SPIE vol. 6152, Mar. 27, 2006.
Svidenko et al. "Dynamic Defect-Limited Yield Prediction by Criticality Factor," ISSM Paper: YE-O-157, 2007.
Barty et al., "Aerial Image Microscopes for the inspection of defects in EUV masks," Proceedings of SPIE, vol. 4889, 2002, pp. 1073-1084.
Budd et al., "A New Mask Evaluation Tool, the Microlithography Simulation Microscope Aerial Image Measurement System," SPIE vol. 2197, 1994, pp. 530-540.
Cai et al., "Enhanced Dispositioning of Reticle Defects Using the Virtual Stepper With Automoated Defect Severity Scoring," Proceedings of the SPIE, vol. 4409, Jan. 2001, pp. 467-478.
Comizzoli, "Uses of Corono Discharges in the Semiconfuctor Industry," J. Electrochem. Soc., 1987, pp. 424-429.
Contactless Electrical Equivalent Oxide Thickness Measurement, IBM Technical Disclosure Bulletin, vol. 29, No. 10, 1987, pp. 4622-4623.
Contactless Photovoltage vs. Bias Method for Determining Flat-Band Voltage, IBM Technical Disclosure Bulletin, vol. 32, vol. 9A, 1990, pp. 14-17.
Cosway et al., "Manufacturing Implementation of Corona Oxide Silicon (COS) Systems for Diffusion Furnace Contamination Monitoring," 1997 IEEE/SEMI Advanced Semiconductor Manufacturing Conference, pp. 98-102.
Diebold et al., "Characterization and produiction metrology of thin transistor gate oxide films," Materials Science in Semiconductor Processing 2, 1999, pp. 103-147.
Garcia et al., "New Die to Database Inspection Algorithm for Inspection of 90-nm Node Reticles," Proceedings of SPIE, vol. 5130, 2003, pp. 364-374.
Granik et al., "Sub-resolution process windows and yield estimation technique based on detailed full-chip CD simulation," Mentor Graphics, Sep. 2000, 5 pages.
Hess et al., A Novel Approach. High Resolution Inspection with Plane Defect Detection, Proceedings of SPIE—International Society for Optical Engineering; Photomask and Next-Generation Lithography Mask Technology 2008, vol. 7028, 2008.
Huang et al., Process Window Impact of Progressive Mask Defects, Its Inspection and Disposition Techniques (go/no-go criteria) Via a Lithographic Detector, Proceedings of SPIE—The International Society for Optical Engineering; 25th Annual Bacus Symposium on Photomask Technology 2005, vol. 5992, No. 1.
Hung et al., Metrology Study of Sub 20 Angstrom oxynitride by Corona-Oxide-Silicon (COS) and Conventional C-V Approaches, 2002, Mat. Res. Soc. Symp. Proc., vol. 716, pp. 119-124.
International Search Report and Written Opinion for PCT Appln. No. PCT/US06/61113 dated Jul. 16, 2008.
International Search Report and Written Opinion for PCT Appln. No. PCT/US08/050397 dated Jul. 11, 2008.
International Search Report and Written Opinion for PCT Appln. No. PCT/US2008/063008 dated Aug. 18, 2008.
International Search Report for PCT/US2003/21907 mailed Jun. 7, 2004.
International Search Report for PCT/US2004/040733 mailed Dec. 23, 2005.
International Search Report and Written Opinion for PCT/US2008/062873 mailed Aug. 12, 2008.
International Search Report for PCT/US2008/62875 mailed Sep. 10, 2008.
International Search Report and Written Opinion for PCT Appln. No. PCT/US06/61112 dated Sep. 25, 2008.
International Search Report for PCT/US2008/70647 mailed Dec. 16, 2008.
Lu et al., "Application of Simulation Based Defect Printability Analysis for Mask Qualification Control," Proceedings of SPIE, vol. 5038, 2003, pp. 33-40.

Martino et al., "Application of the Aerial Image Measurement System (AIMS(TM)) to the Analysis of Binary Mask Imaging and Resolution Enhancement Techniques," SPIE vol. 2197, 1994, pp. 573-584.

Miller, "A New Approach for Measuring Oxide Thickness," Semiconductor International, Jul. 1995, pp. 147-148.

Numerical Recipes in C. The Art of Scientific Computing, 2nd Ed.,© Cambridge University Press 1988, 1992, p. 683.

Karklin et al., "Automatic Defect Severity Scoring for 193 nm Reticle Defect Inspection," Proceedings of SPIE—The International Society for Optical Engineering, 2001, vol. 4346, No. 2, pp. 898-906.

Nagpal et al., "Wafer Plane Inspection for Advanced Reticle Defects," Proceedings of SPIE—The International Society for Optical Engineering; Photomask and Next-Generation Lithography Mask Technology. vol. 7028, 2008.

Otsu, "A Threshold Selection Method from Gray-Level Histograms," IEEE Transactions on Systems, Man, and Cybernetics, vol. SMC-9, No. 1, Jan. 1979, pp. 62-66.

Pang et al., "Simulation-based Defect Printability Analysis on Alternating Phase Shifting Masks for 193 nm Lithography," Proceedings of SPIE, vol. 4889, 2002, pp. 947-954.

Pettibone et al., "Water Printability Simulation Accuracy Based on UV Optical Inspection Images ot Reticle Defects," Proceedings of SPIE—The International Society for Optical Engineering 1999 Society of Photo-Optical Instrumentation Engineers, vol. 3677, No. II, 1999, pp. 711-720.

Phan et al., "Comparison of Binary Mask Defect Printability Analysis Using Virtual Stepper System and Aerial Image Microscope System," Proceedings of SPIE—The International Society for Optical Engineering 1999 Society of Photo-Optical Instrumentation Engineers, vol. 3873, 1999, pp. 681-692.

Sahouria et al., "Full-chip Process Simulation for Silicon DRC," Mentor Graphics, Mar. 2000, 6 pages.

Schroder et al., Corono-Oxide-Semiconductor Device Characterization, 1998, Solid-State Electronics, vol. 42, No. 4, pp. 505-512.

Schroder, "Surface voltage and surface photovoltage: history, theory and applications," Measurement Science and Technology, vol. 12, 2001, pp. R16-31.

Schroder, Contactless Surface Charge Semiconductor Characterization, Apr. 2002, Materials Science and Engineering B, vol. 91-92, pp. 196-228.

Schurz et al., "Simulation Study of Reticle Enhancement Technology Applications for 157 nm Lithography," SPIE vol. 4562, 2002, pp. 902-913.

U.S. Appl. No. 10/677,445 (Horner et al.) entitled Methods for Non-Contacting Differential Voltage Measurements filed on Oct. 2, 2003.

U.S. Appl. No. 11/139,151 (Volk et al.) entitled Methods and Systems for Detecting Changes in Recticle Defectivity Over Time filed on May 27, 2005.

U.S. Appl. No. 12/115,833 (Alles et al.) entitled Methods for Detecting and Classifying Defects on a Recticle filed on May 6, 2008.

U.S. Appl. No. 12/195,024 (Florence et al.) entitled Computer-Implemented Methods for Determining if Actual Defects are Potentially Systematic Defects or Potentially Random Defects filed on Aug. 20, 2008.

U.S. Appl. No. 12/176,095 (Bhaskar et al.) entitled Methods for Generating a Standard Reference Die for Use in a Die to Standard Reference Die Inspection and Methods for Inspecting a Wafer filed on Jul. 18, 2008.

U.S. Appl. No. 60/418,887 (Su et al.) entitled Methods and Systems for Inspecting Reticles Using Aerial Imaging and Die-To-Database Detection filed on Oct. 15, 2002.

U.S. Appl. No. 60/419,028 (Stokowski et al.) entitled Methods and Systems for Inspecting Reticles Using Aerial Imaging At Off-Stepper Wavelengths filed on Oct. 15, 2002.

U.S. Appl. No. 60/485,233 (Peterson et al.) entitled Qualifying Patterns, Patterning Processes, or Patterning Apparatus in the Fabrication of Microlithographic Patterns filed on Jul. 7, 2003.

U.S. Appl. No. 60/526,881 (Hess et al.) entitled Designer Intent filed on Dec. 4, 2003.

U.S. Appl. No. 60/681,095 (Nehmadi et al.) entitled Methods in Mask and Process Qualification filed on May 13, 2005.

U.S. Appl. No. 60/684,360 (Nehmadi et al.) entitled Design-Based Inspection filed on May 24, 2005.

Verkuil et al., "A Contactless Alternative to MOS Charge Measurements by Means of a Corona-Oxide-Semiconductor (COS) Technique, "Electrochem. Soc. Extended Abstracts, 1988, vol. 88-1, No. 169, pp. 261-262.

Verkuil, "Rapid Contactless Method for Measuring Fixed Oxide Charge ASsociated with SIlicon Processing," IBM Technical Disclousre Bulletin, vol. 24, No. 6, 1981, pp. 3048-3053.

Volk et al. "Investigation of Reticle Defect Formation at DUV Lithography," 2002, BACUS Symposium on Photomask Technology.

Volk et al. "Investigation of Reticle Defect Formation at DUV Lithography," 2003, IEEE/SEMI Advanced Manufacturing Conference, pp. 29-35.

Weinberg, "Tunneling of Electrons from Si into Thermally Grown SiO2," Solid-State Electronics, 1977, vol. 20, pp. 11-18.

Weinzierl et al., "Non-Contact Corona-Based Process Control Measurements: Where We've Been, Where We're Headed," Electrochemical Society Proceedings, Oct. 1999, vol. 99-16, pp. 342-350.

Yan et al., "Printability of Pellicle Defects in DUV 0.5 um Lithography," SPIE vol. 1604, 1991, pp. 106-117.

International Search Report and Written Opinion for PCT/US2008/073706 mailed Jan. 29, 2009.

International Search Report and Written Opinion for PCT/US2008/072636 mailed Jan. 29, 2009.

U.S. Appl. No. 12/176,095 (Bhaskar et al.) entitled Methods for Generating a Standard Reference Die for Use in a Die to Standard Reference Die Inspection and Methods for Inspecting a Wafer filed on Jul. 18, 2008.

International Search Report & Written Opinion, PCT/US2008/066328, mailed Oct. 1, 2009.

O'Gorman et al., "Subpixel Registration Using a Concentric Ring Fiducial," Proceedings of the International Conference on Pattern Recognition, vol. ii, Jun. 16, 1990, pp. 249-253.

U.S. Appl. No. 12/116,830 (Su et al.) entitled Computer-Implemented Methods, Systems and Computer-Readable Media for Determining a Model for Predicting Printability of Reticle Features on a Wafer filed on May 6, 2008.

U.S. Appl. No. 12/116,664 (Peterson et al.) entitled Methods and Systems for Detecting Defects in a Reticle Design Pattern filed on May 7, 2008.

* cited by examiner

US 7,689,966 B2

METHODS, SYSTEMS, AND CARRIER MEDIA FOR EVALUATING RETICLE LAYOUT DATA

PRIORITY CLAIM

This application claims priority to U.S. Provisional Application No. 60/609,670 entitled "Methods, Systems, and Carrier Media for Evaluating Reticle Layout Data," filed Sep. 14, 2004, which is incorporated by reference as if fully set forth herein.

BACKGROUND OF THE INVENTION

1. Field of the Invention

The present invention generally relates to methods, systems, and carrier media for evaluating reticle layout data. Certain embodiments relate to a computer-implemented method that includes determining manufacturability, inspectability, and/or printability of reticle layout data.

2. Description of the Related Art

The following description and examples are not admitted to be prior art by virtue of their inclusion in this section.

Designing an integrated circuit involves creating a schematic design that includes individual devices arranged and coupled to perform a particular function. As integrated circuits become increasingly complex, the design of the integrated circuits also increases in complexity. For example, integrated circuits are generally designed to have smaller dimensions and greater circuit density to improve the speed and other characteristics of the integrated circuits.

The integrated circuit design may be developed using any method or system known in the art such as electronic design automation (EDA), computer aided design (CAD), and other integrated circuit design software. Such methods and systems may be used to generate the circuit pattern database from the integrated circuit design. The circuit pattern database includes data representing a plurality of layouts for various layers of the integrated circuit. Data in the circuit pattern database may be used to determine layouts for a plurality of reticles. Reticles or "masks" are used in a lithography process to transfer a pattern to a resist on a wafer. The terms "reticle" and "mask" are used interchangeably herein.

A layout of a reticle generally includes a plurality of polygons that define features in a pattern on the reticle. Typically, these polygons can be generally defined by their size and placement of the reticle. Each reticle is used to fabricate one of the various layers of the integrated circuit. The layers of the integrated circuit may include, for example, a junction pattern in a semiconductor substrate, a gate dielectric pattern, a gate electrode pattern, a contact pattern in an interlevel dielectric, and an interconnect pattern on a metallization layer.

In particular, the reticle is used to pattern a resist in a lithography process step, then the patterned resist is used to form features of the integrated circuit on the wafer. Therefore, the patterned features that are formed on a reticle and are to be transferred to the wafer reflect the characteristics of the features that are included in the integrated circuit design. For example, the features that are formed on the reticle may be based on and are used to form individual components of the integrated circuits such as those described above. The complexity of the integrated circuit design, therefore, has a direct impact on the manufacture and inspection of reticles.

Accordingly, as the complexity of the integrated circuit design increases, successful reticle manufacture becomes more difficult. For instance, as the dimensions of the integrated circuit features and the spacings between the features decrease, the dimensions and spacings of features on the reticle also decrease. In this manner, it becomes more difficult to form these features on a reticle due to, for example, limitations of the reticle manufacturing process. In a similar manner, it becomes more difficult to inspect these features due to limitations of the reticle inspection processes. Furthermore, as is known in the art, the difficulty of successfully reproducing these features on wafers increases as the dimensions and spacings decrease.

In addition, as the dimensions of integrated circuit features approach the wavelength of the energy source used to print the reticle pattern on a wafer, reticle enhancement techniques (RET) such as optical proximity correction (OPC) features are increasingly relied upon to increase the accuracy of the transfer of the reticle features to the wafer. In particular, RET features cause the pattern printed on a wafer to differ significantly from the pattern physically formed on a reticle. Examples of reticle enhancing techniques include, but are not limited to, OPC features, phase shifting regions, polarization reticles, multiple exposures, off-axis illumination, illumination shapes, and dipole illumination.

OPC features generally take the form of sub-resolution features that are formed on the reticle but which do not print on the wafer. Instead, the OPC features are designed to increase or decrease the amount of light incident on the wafer proximate certain portions of the features such as corners. The OPC features further complicate the design, manufacture, and inspection of the reticle. However, due to the assistance that these features provide in printing features with acceptable characteristics, almost all reticles today include OPC features or another type of RET features. Furthermore, optical effects such as mask error enhancement factor (MEEF) may cause additional distortion of the final image at the wafer level. MEEF may be generally defined as the ratio of the critical dimension of a feature printed in a resist to the critical dimension of a structure formed on a reticle.

Generally, prior to manufacturing a reticle, the reticle layout data that is generated from an integrated circuit design will be checked. The reticle layout data is generally checked using a design rule checking (DRC) technique and/or an optical rule checking (ORC) technique. A DRC tool checks a mask layout file for design rule violations and identifies any violations in an output file. Design rules can include, for example, minimum line spacings, minimum line widths, minimum gate widths, or other geometric layout parameters. The design rules are based on, for example, the manufacturing process to be used to manufacture the resulting design layout. An ORC tool generally analyzes the edge collection by simulating the performance expected on the wafer and determining whether the wafer structures will violate a set of fabrication tolerances. Therefore, the optical rules are based on the lithography process to be used to manufacture wafers with the reticle.

Many DRC and ORC techniques are known in the art, and the results of DRC and ORC are used to correct design rule or optical rule violations. For example, systems and methods for correcting design rule violations in a mask layout file are illustrated in U.S. Published Patent Application No. 2002/0144230 by Rittman, which is incorporated by reference as if fully set forth herein. One method described by Rittman includes correcting design rule violations in a mask layout file by comparing a feature dimension in a mask layout file with a design rule in a technology file. If the feature dimension is less than the design rule, a design rule violation is identified and automatically corrected in the mask layout file. The design rule violation in the mask layout file may be automatically corrected by adjusting the feature dimension until the feature dimension is approximately equal to or greater than a design rule in the technology file. The method is intended to automate correction of the mask layout file to eliminate new design rule violations that may be created when a layout designer manually corrects the mask layout file.

While this and other methods known in the art for correcting design rule violations in a mask layout file have proven to be somewhat successful, DRC and ORC systems currently in use suffer from several limitations. For example, typical systems generally operate entirely on the data as drawn by the layout and RET decoration programs without accounting for the changes that will occur to the data in the mask making and wafer printing processes. In many cases, the mask maker or "shop" will apply sizing corrections to the data of which the designer is unaware. These process biases may alter some of the features included in the design, especially sub-resolution OPC structures such as scattering bars, serifs, or small edge extensions such that they become so small that they disappear from the data entirely or become large enough to cause problems such as bridging in either the reticle or wafer printing process.

In a further example, the list of design rules becomes impractically long as processes become more complex. While the design rules several years ago could be written on a single piece of paper, current processes can have well over 1,000 design rules that need to be checked. Encoding the design rules into software and ensuring that they completely encompass all possible patterning errors that will reduce device yield is increasingly difficult. If the design rule developer fails to anticipate every possible violation that would impact device performance, these violations will pass through the DRC system undetected. Even ORC systems, while making use of more detailed simulation, still require manual input of long rule lists for the checking component.

DRC and ORC simulations also do not capture the details of the mask making process and offer no means of calibrating the patterns to reflect what will actually be written on the reticle. In another example, the existing checkers do not take into account the key question of whether the pattern as laid out by the design program can actually be written by the reticle processing tools. For example, the current state of the art integrated circuit designs can produce complex designs and layouts that pass the current rule checks, but cannot be manufactured either because the RET pattern is too complex to be written correctly on the reticle, inspected on the reticle, and/or printed at the wafer level. Even so called "correct by construction" approaches only optimize the original, pre-OPC layout to eliminate patterns with design rule violations. However, once the OPC structures are added, numerous design rule violations are still possible. Therefore, the existing rule checkers act on idealized data without addressing the key question of whether or not the design can be written and inspected to yield a manufacturable process from design to reticle to wafer levels.

Many design databases take the initial physical design and add incredibly complex RETs which expand the design data by more than an order of magnitude. These huge layout files include tiny jogs, edge extrusions, and minute critical dimension (CD) variations that cannot possibly be reproduced by the mask writing tools. The resulting large data files lead to very long and expensive reticle writing times which are basically wasted since the pattern cannot be reproduced with all of the tiny CD variations and sub-resolution jogs.

In yet another example, the currently available DRC and ORC systems do not take into account whether or not the pattern can be adequately inspected. For example, even if the patterns could be written, no inspection tool is available that is capable of verifying the correct writing of such patterns and no exposure tool is believed to be available that could print such patterns. Therefore, the effort is wasted. Some of the small RET implementations may actually be counterproductive since in trying to write them on the reticle only a partial pattern can be defined, which can end up creating defects on the reticle and later on the wafer. Writing such large data files on a reticle is relatively expensive. As such, it is highly desirable to detect such problems in the data before the design is committed to the mask writing process thereby saving time and money.

Accordingly, it may be advantageous to develop methods, systems, and carrier media that can be used to evaluate reticle layout data to determine the manufacturability, inspectability, and/or printability of the reticle layout data while eliminating at least some of the disadvantages described above.

SUMMARY OF THE INVENTION

The following description of various embodiments of computer-implemented methods, carrier media, and systems is not to be construed in any way as limiting the subject matter of the appended claims.

An embodiment relates to a computer-implemented method for evaluating reticle layout data. The method includes generating a simulated image using the reticle layout data as input to a model of a reticle manufacturing process. The simulated image illustrates how features of the reticle layout data will be formed on a reticle by the reticle manufacturing process. The method also includes determining manufacturability of the reticle layout data using the simulated image. The manufacturability is a measure of how accurately the features will be formed on the reticle.

In one embodiment, the manufacturability is determined by applying design rule checks to the simulated image. In another embodiment, the manufacturability is determined by comparing the simulated image to the reticle layout data. In yet another embodiment, the manufacturability is determined by analyzing different portions of the simulated image based on designer intent data associated with the different portions. In some embodiments, the method includes altering the reticle layout with reticle processing biases prior to generating the simulated image. In addition, the method may include altering the model using data measured on reticles fabricated using the reticle manufacturing process.

In some embodiments, the method also includes determining inspectability of the reticle layout data using the simulated image. Determining the inspectability may include determining an approximate signal-to-noise ratio that data produced by inspection of the reticle will have. Determining the inspectability may also or alternatively include determining a defect size that is the smallest that an inspection tool could detect on the reticle. In one embodiment, determining the inspectability includes analyzing different portions of the simulated image based on designer intent data associated with the different portions.

In another embodiment, the method includes performing generation of the simulated image for different parameters of the reticle manufacturing process. In such an embodiment, determining the inspectability may be performed for different simulated images generated with the different parameters. In one such embodiment, the different parameters include different reticle writing tools. In another such embodiment, the method includes selecting one of the different reticle writing tools that could produce reticles with higher inspectability than another of the different reticle writing tools. In a similar manner, the method may include selecting a reticle writing tool that could produce reticles with greater manufacturability than other reticle writing tools.

Some embodiments of the method include determining printability of the reticle layout data using the simulated image. In one such embodiment, determining the printability includes generating an additional simulated image that illustrates how the features of the reticle will be printed on a wafer by a lithography process. In some embodiments, determining the printability includes applying design rule checks to the additional simulated image. The printability of the reticle layout data may also be determined by applying optical rule checks to the additional simulated image. Furthermore, determining the printability may include comparing the additional simulated image to an ideal image of the features and locating errors in the additional simulated image by comparing edge placement of individual features in the additional simulated image to edge placement of corresponding features in the ideal image. In other embodiments, determining the printability includes analyzing different portions of the additional simulated image based on designer intent data associated with the different portions.

Some embodiments of the method include determining the printability by generating additional simulated images that illustrate how the features of the reticle will be printed on a wafer by a lithography process at different process parameters. In one such embodiment, the different process parameters include different types of lithography exposure tools. In additional embodiments, determining the printability includes generating an additional simulated image that illustrates how the features of the reticle will be printed on a wafer by a lithography process using the simulated image as input to a lithography process model. Such a method may also include altering the lithography process model using data measured on wafers printed using the lithography process.

In one embodiment, the simulated image illustrates how all of the features of the reticle layout data will be formed on the reticle. The reticle layout data may include optical proximity correction (OPC) feature data, aberration correction feature data, phase shift feature data, or a combination thereof. In some embodiments, the method includes altering one or more parameters of the reticle manufacturing process to generate one or more revised reticle manufacturing processes. Such a method may also include generating simulated images for the one or more revised reticle manufacturing processes and determining the manufacturability of the reticle layout data for the one or more revised reticle manufacturing processes. In addition, the method may include determining which of the one or more revised reticle manufacturing processes provides the largest improvement in the manufacturability of the reticle layout data. In one such embodiment, the one or more parameters may include different types of mask writing tools.

In some embodiments, determining the manufacturability of the reticle layout data includes identifying defects in the reticle layout data based on the simulated image. One such embodiment includes allowing a user to review the defects and to alter the reticle layout data to correct the defects. In this manner, the method may be used for "manual" reticle layout data correction. In a different embodiment, the method includes altering the reticle layout data to correct the defects. As such, the method may include "automatic" or computer-implemented reticle layout data correction. Each of the embodiments of the method described above may include any other step(s) described herein.

Another embodiment relates to a carrier medium. The carrier medium includes program instructions executable on a computer system for performing a method for evaluating reticle layout data. The method includes generating a simulated image using the reticle layout data as input to a model of a reticle manufacturing process. The simulated image illustrates how features of the reticle layout data will be formed on a reticle by the reticle manufacturing process. The method also includes determining manufacturability of the reticle layout data using the simulated image. The manufacturability is a measure of how accurately the features will be formed on the reticle. The method may include any other step(s) described herein. The carrier medium may be further configured as described herein.

An additional embodiment relates to a system configured to evaluate reticle layout data. The system includes a computer system. In addition, the system includes a carrier medium that includes program instructions executable on the computer system for generating a simulated image using the reticle layout data as input to a model of a reticle manufacturing process. The simulated image illustrates how features of the reticle layout data will be formed on a reticle by the reticle manufacturing process. The program instructions are also executable on the computer system for determining manufacturability of the reticle layout data using the simulated image. The manufacturability is a measure of how accurately the features will be formed on the reticle. The system may be further configured as described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
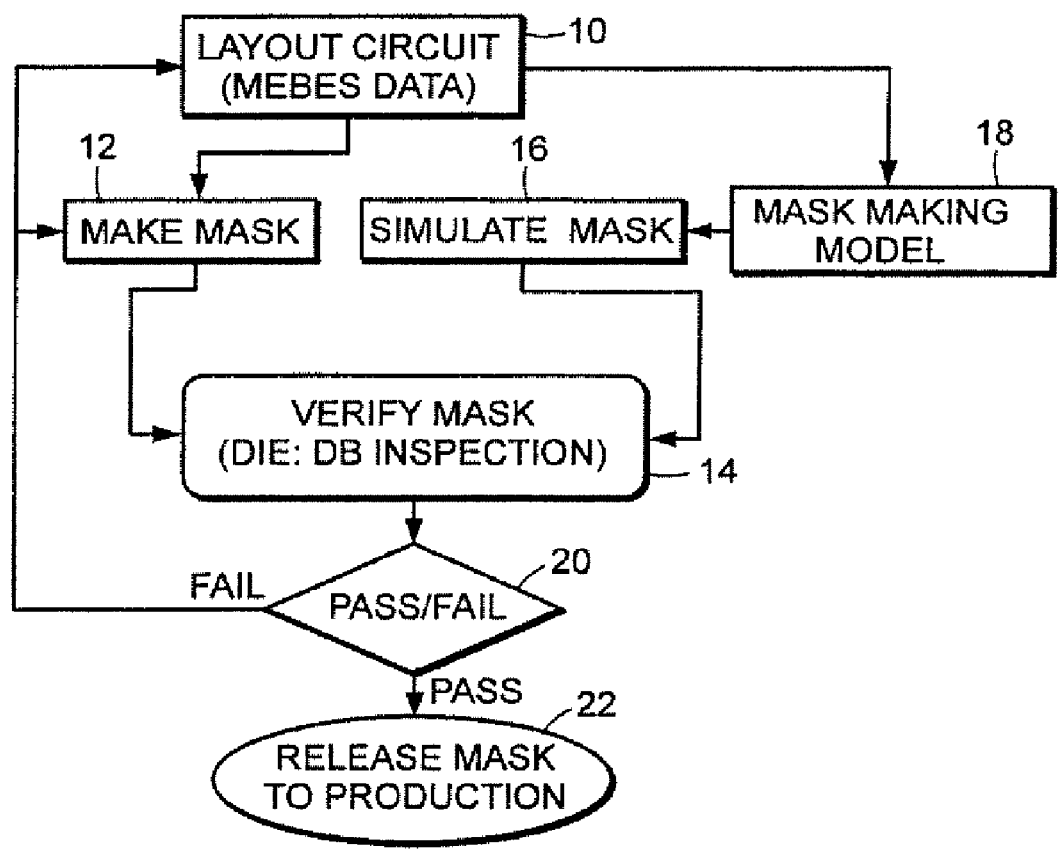
FIG. 1 is a flow chart illustrating one example of a computer-implemented method that has been used for reticle inspection.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "reticle" and "mask" are used interchangeably herein. A reticle generally includes a transparent substrate such as glass, borosilicate glass, and fused silica having opaque regions formed thereon in a pattern. The opaque regions may be replaced by regions etched into the transparent substrate. Many different types of reticles are known in the art, and the term reticle as used herein is intended to encompass all types of reticles.

A process for manufacturing a reticle is similar to a wafer patterning process. For example, the goal of reticle manufacturing is generally to form a pattern in an opaque material such as a relatively thin chrome layer on a substantially transparent substrate such as glass. In addition, other appropriate opaque materials that may be used for reticle manufacturing include, but are not limited to, chromium, chromium oxide, chromium nitride, and molybdenum/silicon. Appropriate thicknesses for chrome layers may be approximately 1000 Å and may be deposited upon a glass substrate by sputtering. Additional appropriate transparent materials that may be used for reticle manufacturing include borosilicate glass or fused-silica ($SiO_2$, "quartz"), which have relatively stable dimensions and transmission properties for wavelengths of exposure systems. Additional materials may also be used for reticle manufacturing. For example, a film underlying an opaque material may act as an adhesion layer. Such an adhesion layer may include, for example, a mixture of chromium, nitrogen, and oxide. In addition, a film formed on top of the opaque material may act as an anti-reflective layer. An appropriate anti-reflective layer may be formed of, for example, a relatively thin layer of $Cr_2O_3$.

Reticle manufacturing may include a number of different steps such as pattern generation, which may include moving a glass substrate having a chrome layer and a resist layer formed thereon under a light source as shutters are moved and opened to allow precisely shaped patterns of light to shine onto the resist thereby creating the desired pattern. Alternatively, reticles may be made with laser or e-beam direct write exposure. Laser exposure allows the use of standard optical resists and is faster than e-beam direct write exposure. In addition, laser systems are also less expensive to purchase and operate. Direct write laser sources are turned on and off with an acousto-optical modulator (AOM). An example of a commercially available direct write laser system is the ALTA 3000® laser writer available from ETEC Systems, Inc., Hayward, Calif. Direct write e-beam systems are often used to manufacture complex reticles since they produce finer line resolution than laser systems. In addition, direct write e-beam systems can also write larger die sizes than laser systems. Examples of commercially available direct write e-beam systems include the MEBES 4500 and 5000 systems available from ETEC Systems, Inc.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities. A wafer may include one or more layers formed upon a substrate. For example, such layers may include, but are not limited to, a resist, a dielectric material, and a conductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated. Although the embodiments are described herein with respect to integrated circuits, it is to be understood that the embodiments described herein may be used for reticle layout data for any device known in the art.

As used herein, the term "lithography system" is used to generally refer to any lithography system that prints images of a reticle onto a wafer using light. The lithography system may include a scanning projection system or a step and scan system, which are both commonly referred to as a "scanner" or a step-and-repeat system, also called a "stepper." The lithography system may include any exposure system known in the art such as systems commercially available from Nikon, ASM Lithography, Canon, or Integrated Solutions, Inc. The terms "lithography system," "scanner," and "stepper" are used interchangeably herein.

Resolution enhancement technologies (RET) such as OPC and Phase Shift Masks (PSM) are increasingly being applied to integrated circuit designs in order to print features on device wafers which are smaller than the wavelength of light used as the exposure source. These RETs often involve the addition of extra features to the design including sub-resolution assist features (SRAF) and serifs with the result that the layout of the design on the photomask or reticle becomes extremely complex. Verifying that the RET features will print correctly on the wafer and that the SRAFs will not print but will cause the main features to print correctly becomes a difficult task that is beyond the simple logical tests performed by design rule check (DRC) or optical rule check (ORC) software.

The following description includes methods having three general parts, which may be performed separately or in some combination thereof. The methods described herein are advantageous in that they can be used to 1) ensure that the design, including all RET features, can actually be written on the photomask in a manner that will replicate the designer intent at the reticle plane; 2) ensure that the design, including all RET features, can be written on the reticle in a manner that will be inspectable (i.e., that the features as printed on the reticle can be compared to either a database of the desired features or to another instance of the desired features within the design with sufficient discrimination so that errors in the pattern fidelity can be detected), and 3) ensure that the reticle pattern, including all RET features, will print at the wafer level in a manner that will replicate the designer intent and yield the appropriate pattern on the wafer. Therefore, the methods described herein can be used to determine if RET enhanced reticle layout data, or any other reticle layout data, is manufacturable, inspectable, and/or transferable to the wafer level.

Turning now to the drawings, FIG. 1 illustrates a method that has previously been used for reticle inspection. The method starts with reticle layout data 10, which defines the circuit layout that is to be formed on a reticle. The reticle layout data may be in the form of a MEBES jobdeck, a GDSII file, or OASIS data, which are standard file types for reticle writing tools. The method also includes making the mask, as shown in step 12. Making the mask may be performed as described above.

As shown in step 14, the method includes inspecting or verifying the mask. Inspecting the mask in this method may be performed using any reticle inspection tool known in the art. For example, the inspection tool may be configured to generate images of the reticle. Detecting defects on the reticle includes comparing data generated by the reticle inspection with simulated mask data 16. Simulated mask data 16 may be generated using mask making model 18 with reticle layout data 10 as input. Such a mask inspection may be commonly referred to as a "die-to-database inspection" since the data generated by inspection is compared to data generated from a database.

The features as printed on the reticle will differ from the features as defined in the reticle layout data. Therefore, the mask making model is used to modify the reticle layout data to account for differences in the patterned features of the reticle as defined in the reticle layout data versus how they will be printed on the reticle. In one particular example, the features as printed on the reticle will generally have somewhat rounded corners particularly in comparison to the features in the reticle layout data. In this example, the mask making model may account for corner rounding of features. As such, using the simulated image as a comparison to the inspection data decreases the number of nuisance defects that will be detected on the reticle thereby increasing the accuracy of the inspection.

Any suitable technique may be used to perform a simulation of the effects of a particular process on reticle layout data. There are several software tools that simulate effects of a particular reticle generation process including, for example, ProBEAM, which is commercially available from KLA-Tencor, San Jose, Calif. Examples of an apparatus and methods for generating an inspection reference pattern are illustrated in U.S. Pat. No. 6,691,052 to Maurer, which is incorporated by reference as if fully set forth herein. Additional examples of methods and systems for inspecting reticles using aerial imaging and die-to-database detection are illustrated in U.S. patent application Ser. No. 10/679,857 by Stokowski et al., which is also incorporated by reference as if fully set forth herein. Further examples of methods for generating a reference image of a reticle are illustrated in U.S. patent application Ser. No. 10/793,599 by Howard et al., which is incorporated by reference as if fully set forth herein.

As further shown in FIG. 1, based on the results of the reticle inspection, the method may include determining if the reticle passes or fails qualification, as shown in step 20. Determining if the reticle passes or fails qualification generally includes evaluating defects detected on the reticle to determine characteristics of the defects such as how many defects are detected on the wafer, how many defects of a particular size are detected on the wafer, the location of defects on the wafer, number of "killer" defects on the wafer, etc. The qualification standards are generally defined by the customer or the integrated circuit designer.

If the reticle passes qualification, the reticle may be released to production, as shown in step 22. Alternatively, if the reticle has failed qualification, then another mask may be made with the same reticle layout data.

Although the above-described method has some advantages such as decreasing the number of nuisance defects that are detected on the reticle, this method is also lacking in some respects. For example, the method does not include evaluating the reticle layout data to determine if the reticle layout data can be manufactured reproducibly. Of course, it would be possible to roughly estimate the manufacturability of the reticle layout data from the inspection data, for example, if entire features are simply missing. However, it is not possible in this method to get even a rough estimate of the manufacturability of the reticle layout data without actually manufacturing the reticle. Therefore, the method requires the relatively expensive reticle manufacturing to be performed while providing only a rough estimate of the manufacturability.

In addition, since the mask making model simply alters the reticle layout data to account for changes in the features due to the mask making process, portions of the reticle layout data that cannot be manufactured properly may be "defective" in the reference image. Therefore, portions of the mask that are not manufacturable may have substantially the same characteristics in the inspection and reference images. As such, defects in the fabricated mask due to non-manufacturability in the reticle layout data may not even be detected by the reticle inspection.

The method shown in FIG. 1 also does not account for any non-inspectable features of the reticle. For example, certain features that were fabricated on the reticle may be too small to be imaged by the inspection system. As such, certain features of the reticle layout data may not be inspectable. Therefore, it is impossible to ascertain whether or not these features have been printed on the reticle at all, whether or not these features have been printed within design limits, and whether or not these features affect the qualification status of the reticle.

Furthermore, the method shown in FIG. 1 does not account for any non-printable features of the reticle or features that will not print with adequate accuracy on a wafer. In particular, the method does not include evaluating the reticle layout data to determine how the reticle layout data will print on a wafer. In addition, in determining if the reticle passes qualification standards, the method does not take into consideration how the features on the reticle will print on the wafer. Since the inspection may be substantially inaccurate due to non-inspectable features as described above, it is conceivable that the features of the reticle will not print on a wafer as the integrated circuit designer had intended. In the worst case scenario, the reticle could be erroneously qualified, wafers could be printed with the reticle in production, and the defects in the integrated circuit could be detected at final test.

FIGS. 2-5 illustrate various embodiments of a computer-implemented method for evaluating reticle layout data that provide substantial improvements over the method shown in FIG. 1. In particular, the methods shown in FIGS. 2-5 can be used to determine the manufacturability, inspectability, and/or printability of reticle layout data. It is noted that the steps shown in FIGS. 2-5 are not essential to practice of the method. One or more steps may be omitted or added to the methods illustrated in FIGS. 2-5, and the methods can still be practiced within the scope of these embodiments.

Figure 2:
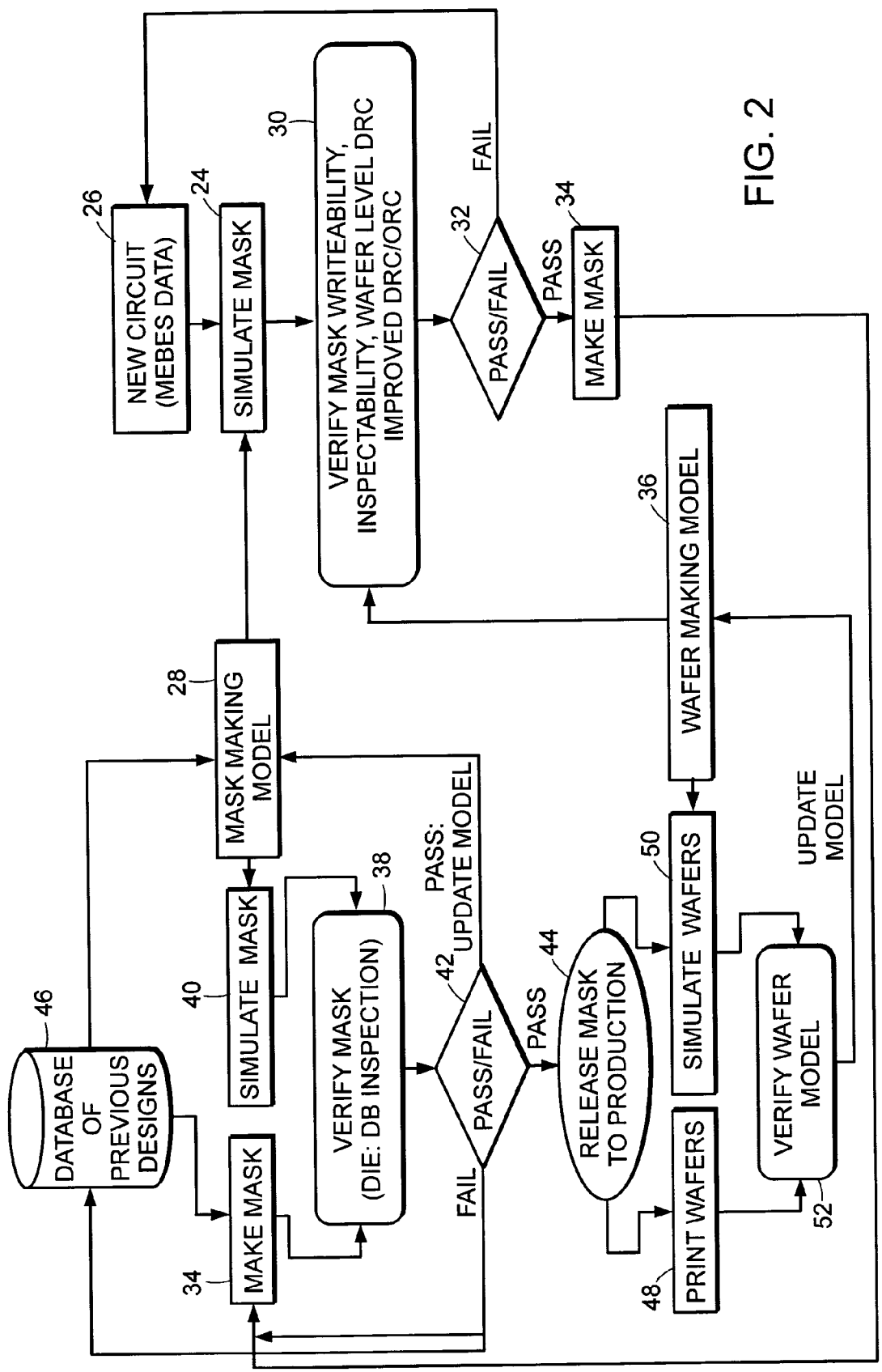
FIGS. 2-5 are flow charts illustrating various embodiments of a computer-implemented method for evaluating reticle layout data.

As shown in FIG. 2, one embodiment of the method includes generating simulated image 24 of a mask using reticle layout data 26 as input to model 28 of a reticle manufacturing process. The reticle layout data may be in the form of a MEBES jobdeck, a GDSII file, or OASIS data, which are standard file types for reticle writing tools. The reticle layout data may include data relating to RET features. For example, the reticle layout data may include OPC feature data, aberration correction feature data, phase shift feature data, or a combination thereof. The reticle layout data may also include data for any other RET features known in the art. Model 28 may include any suitable model known in the art. Preferably, the model takes into account a number of process parameters of the reticle manufacturing process such as the type of mask writing tool that will be used for manufacture of the reticle, characteristics of the mask writing tool, characteristics of a resist to be used in the reticle manufacturing process, etc.

The simulated image illustrates how features of the reticle layout data will be formed on a reticle by the reticle manufacturing process. In one embodiment, the reticle layout data including the RET features is rendered by software to simulate how the features in the reticle layout data will be printed on the reticle. In addition, the simulated image may illustrate how all of the features of the reticle layout data will be formed on the reticle. As such, the method described herein is unlike methods for classifying and analyzing defects detected on a reticle that include simulating how a reticle defect will print on a wafer in that such methods generate a simulated image for only the portion of the reticle proximate the defect. However, since the methods described herein are concerned with any reticle features that may compromise the manufacturability of the reticle layout data, the methods described herein generate substantially different simulated images.

The method described herein is also different from methods that generate a simulated image of reticle layout data that will be used as a reference image for reticle inspection in that such methods do not include determining the manufacturability of the reticle layout data. In contrast, as shown in step 30, the method described herein includes determining manufacturability of the reticle layout data using the simulated image. The manufacturability is a measure of how accurately the features will be formed on the reticle. For example, the simulated image can be compared to the reticle layout data, and any defects (e.g., areas which can not be written properly on the reticle) in the reticle layout data are identified. In another example, the manufacturability may be determined by applying design rule checks to the simulated image.

In an additional example, the manufacturability of the reticle layout data may be determined by analyzing different portions of the simulated image based on designer intent data associated with the different portions. Designer intent data may be generally defined as the criticality associated with different portions of reticle layout data. For example, features that will be used to form gate electrodes of the integrated circuit may be flagged as critical while features that will be used to form field oxide regions of the integrated circuit may be flagged as non-critical. The designer intent data may include designations identifying different types of regions of the reticle, different types of features on the reticle, and/or different portions of features on the reticle. The different types of regions, features, or portions of features may include, for example, critical and non-critical regions, features, or portions of features as described in more detail herein. The designations may vary depending upon the circuit pattern database generated from the IC design.

A circuit pattern database may include designations as described above. The designations may include, for example, flags or tags associated with different types of regions, features, or portions of features on the reticle. The designations, however, may include any indicia suitable to distinguish one type of region, feature, or portion of a feature from another type. Each region, feature, or portion of a feature, or only some of the regions, features, or portions of features, on the reticle may be associated with a designation. Data in the circuit pattern database representing a layout of a reticle may be separate from data in the circuit pattern database representing the designations. In addition, different types of designations may be separated in the circuit pattern database. For example, the circuit pattern database may include a first set of data that includes designations for critical regions, features, or portions of features on the reticle and a second set of data that includes designations for non-critical regions, features, or portions of features on the reticle. Alternatively, different designations may be combined into a single set of data.

Additional examples of designer intent data and methods of use for reticle inspection are illustrated in U.S. Pat. No. 6,529,621 to Glasser et al. and PCT Application No. WO 00/36525 by Glasser et al., which are incorporated by reference as if fully set forth herein. A system or method as described herein may also include any of the elements or steps illustrated by Glasser et al. The designer intent data may be provided directly to a system as described further herein.

In an additional step (not shown), the method may include altering the reticle layout data by applying any mask processing biases to the reticle layout data before the simulated image is generated and the manufacturability is determined. The mask processing biases are the changes to the reticle layout data that are usually performed by the mask manufacturer to account for known effects of the reticle manufacturing processes on characteristics of the reticle features. For example, often a mask manufacturer will increase the size of features in the reticle layout data prior to manufacturing to account for reductions in the features sizes formed on the reticle due to an etch process. As such, the reticle manufacturability analysis can be performed on the sized data.

As shown in step 32, the method may include determining whether or not the reticle layout data meets qualification standards. The qualification standards may define an acceptable number of defects, acceptable types of defects, acceptable sizes of defects, and the like. In this manner, the qualification standards may also define acceptable manufacturability standards for the reticle layout data. The qualification standards may be set by the designer or the customer. If the data meets qualification standards, then the mask may be manufactured as shown in step 34 with the reticle layout data and the reticle manufacturing process. The reticle may be fabricated as described above.

If the reticle layout data does not meet qualification standards, then the method may include altering reticle layout data 26. Preferably, the reticle layout data is altered to improve the manufacturability of the reticle layout data. In one embodiment, the method may include allowing a user to review the defects that are detected in step 32 and to alter the reticle layout data to correct the defects. In this manner, the computer-implemented method may be configured for "manual" defect correction. For example, a system configured to perform one or more of the computer-implemented methods described herein may be coupled to one or more of the EDA tools used to create the OPC patterns to provide immediate feedback and correction before the mask is made. Errors due to the manufacturability, inspectability, and/or printability could be flagged and displayed on the EDA screen. The user could then change the layout or OPC corrections and recheck the data to ensure that the pattern will pass before committing the design to the mask making process.

In a different embodiment, the computer-implemented method includes altering the reticle layout data to correct the defects. As such, this embodiment of the computer-implemented method is configured for "automatic" defect correction. In one implementation, this correction could be done automatically by software in a closed loop method with no user intervention. In one embodiment, after the data is altered, another simulated image may be generated as described above, and the manufacturability of the altered reticle layout data may be determined.

In some embodiments, the method includes in step 30 determining inspectability of the reticle layout data using the simulated image generated in step 24. For example, software used by the method may include an inspection model (not shown) that simulates how the inspection tool will "see" the reticle. In one embodiment, determining the inspectability includes determining an approximate signal-to-noise ratio that data produced by inspection of the reticle will have. In particular, the method can include determining if there will be an adequate signal-to-noise ratio to correctly disposition relatively small defects. In another embodiment, the inspectability is determined by determining the smallest defect size that an inspection tool could detect on the reticle. In some embodiments, determining the inspectability includes analyzing different portions of the simulated image based on designer intent data associated with the different portions.

In one embodiment, a simulated image is generated for different parameters of the reticle manufacturing process, and the inspectability is performed on the different simulated images generated with the different parameters. For example, the model may include a range of expected reticle process variations that can be used to determine if the design will result in an inspectable pattern over the expected range of reticle process conditions. The different parameters may also include different reticle writing tools. Therefore, this procedure can also be performed with different models for each (or one or more) of the different reticle writing tools available to the user. Based on the results of this inspectability check, the method may include selecting one of the different reticle writing tools that could produce reticles with higher inspectability than another of the different reticle writing tools. In some embodiments, the user may select the writing tool that has the best tolerance for producing an inspectable pattern for the given design. However, the reticle writing tool may be selected automatically.

The inspectability of the reticle layout data may be determined for each version of the reticle layout data that is generated. For example, each time the reticle layout data is altered as described above to improve the manufacturability of the data, the inspectability may be determined. Alternatively, the inspectability of the reticle layout data may be determined for the reticle layout data that passes the manufacturability qualification standards. Therefore, the reticle layout data may be altered several times to meet the manufacturability qualification standards before inspectability is determined.

In addition, or alternatively, the method may include in step 30 determining printability of the reticle layout data using the simulated image generated in step 24. For example, the method may use software that includes wafer simulation model 36, or "lithography process model" which is configured to predict how the reticle layout data will appear when printed at the wafer level. The wafer simulation model may include parameters that account for variations in the lithography process as well as a resist. The resist model may include any suitable resist model known in the art, and a specific resist model may be generated using any method known in the art.

In particular, the method may use the simulated image that illustrates how the reticle layout data will be formed on the reticle as input to generate an additional simulated image that illustrates how the features of the reticle will be printed on a wafer by a lithography process. Therefore, since the printability of the reticle layout data is based on how the features of the reticle will actually be manufactured on the reticle and "seen" by the wafer, the printability assessments performed as described herein will be more accurate than printability assessments performed using any other method.

Determining the printability of the reticle layout data may include applying DRC and/or ORC to the additional simulated image. For example, the traditional DRC and ORC checks which were typically performed at the reticle level can be applied instead at the wafer level to determine if any design rule violations will occur. In another embodiment, determining the printability of the reticle layout data includes comparing the additional simulated image to an ideal image of the features. The ideal image may be generated directly from the reticle layout data and will generally be representative of how the integrated circuit designer would like the features to be formed on the wafer. However, since the ideal image will not include images of the RET features, the RET features may be removed from the reticle layout data before the ideal image is generated. Such an embodiment may also include locating errors in the additional simulated image by comparing edge placement of individual features in the additional simulated image to edge placement of corresponding features in the ideal image. In some embodiments, the printability is determined by analyzing different portions of the additional simulated image based on designer intent data associated with the different portions.

The printability checks can be run at best focus and exposure conditions, or they can be run across the full range of expected dose/focus conditions commonly referred to as the "process window" to see if any rule violations will occur. For example, in one embodiment, determining the printability of the reticle layout data includes generating additional simulated images that illustrate how the features of the reticle will be printed on a wafer by a lithography process at different process parameters. In one such embodiment, the different process parameters include different types of lithography exposure tools. Therefore, the method may include, in some embodiments, determining the lithography exposure tool that provides the best printability for the reticle layout data.

The printability of the reticle layout data may be determined for each version of the reticle layout data that is generated. For example, each time the reticle layout data is altered as described above to improve the manufacturability and/or the inspectability of the data, the printability may be determined. Alternatively, the printability of the reticle layout data may be determined for the reticle layout data that passes the manufacturability, and optionally the inspectability, qualification standards. Therefore, the reticle layout data may be altered several times to meet the manufacturability and/or inspectability qualification standards before printability is determined.

As shown in FIG. 2, the method may also include inspecting or verifying the reticle, as shown in step 38, after it has been fabricated. Inspecting the mask in this method may be performed using any reticle inspection tool known in the art. For example, the inspection tool may be configured to generate images of the reticle. The inspection tool may be further configured as described herein. In addition, the method may include generating simulated mask 40 from mask making model 28. The simulated mask may be used to detect defects on the reticle by comparison to data generated by the reticle inspection. Such a mask inspection may be commonly referred to as a "die-to-database inspection" since the data generated by inspection is compared to data generated from a database. Simulated mask 40 may be generated using mask making model 28 with the reticle layout data as input. In particular, the mask making model may be used to generate simulated mask 40 using as input the reticle layout data that is actually used for manufacturing the reticle. In this manner, the reticle layout data that is used to generate the simulated mask may have been altered to meet manufacturability standards for the reticle.

The mask making model is used to modify the reticle layout data to account for differences in the patterned features on the reticle as defined in the reticle layout data versus how they will be printed on the reticle. For example, the features as printed on the reticle will differ from the features as defined in the reticle layout data. In one particular example, the features as printed on the reticle will have somewhat rounded corners particularly in comparison to the features in the reticle layout data. In this example, the mask making model may account for corner rounding of features. As such, using the simulated image as a comparison to the inspection data decreases the number of nuisance defects that will be detected on the reticle thereby increasing the accuracy of the inspection.

As further shown in FIG. 2, based on the results of the reticle inspection, the method may include determining if the reticle passes or fails qualification, as shown in step 42. Determining if the reticle passes or fails qualification generally includes evaluating defects detected on the reticle to determine characteristics of the defects such as how many defects are detected on the wafer, how many defects of a particular size are detected on the wafer, the location of defects on the wafer, number of "killer" defects on the wafer, etc. The qualification standards are generally defined by the customer or the integrated circuit designer.

If the reticle passes qualification, the reticle may be released to production, as shown in step 44. In addition, the method may include altering the model of the reticle manufacturing process using data measured on reticles fabricated using the reticle manufacturing process. For example, as shown in FIG. 2, if the reticle passes qualification, mask making model 28 may be updated with the experimental information about the reticle that was generated during inspection. The updated mask making model may then be used to generate additional simulated images of the reticle layout data and simulated images of other reticle layout data. In this manner, the mask process model could be calibrated using inspection data generated as described herein or any other external source of data, such as SEM images, or by linking the model updating function to the built-in calibration function that is available on KLA-Tencor die-to-database reticle inspection tools.

Alternatively, if the reticle has failed qualification, then another mask may be made with the same reticle layout data. In addition, if the reticle fails qualification, then the reticle layout data may be stored in database 46 of previous integrated circuit designs. Database 46 may also provide previous integrated circuit designs to mask making model 28 and mask making step 34. In yet another alternative, the reticle layout data may be modified based on the inspection data, and the modified reticle layout data may be used to fabricate another mask. In a further example, the qualification failure may indicate a problem with the reticle writing tool. Therefore, the method may include altering one or more parameters of the reticle writing tool.

As further shown in FIG. 2, after the reticle is released to production, the reticle may be used to print wafers, as shown in step 48. The wafers may be printed using any lithography process and tool(s) known in the art. In addition, the wafers may be printed using the best known process parameters (e.g., focus, exposure, etc.) of the lithography process to print the wafers. The method may also include using wafer making model 36 to generate simulated images of how the reticle will print on the wafer, as shown in step 50. The simulated images of the printed wafers may be compared to images of the printed wafers. Such comparisons may be used to verify the wafer model, as shown in step 52. For example, experimental data generated by inspection and/or metrology of the printed wafers may be compared to the simulated images generated in step 50. Any differences between the printed wafers and the simulated images may be analyzed to determine if the differences indicate an inaccuracy in the model. The differences between the printed images and the simulated images may then be used to correct this and any other inaccuracies. Therefore, the method may include altering a lithography process model using data measured on wafers printed using the lithography process. The method shown in FIG. 2 may include any other step(s) described herein.

Figure 3:
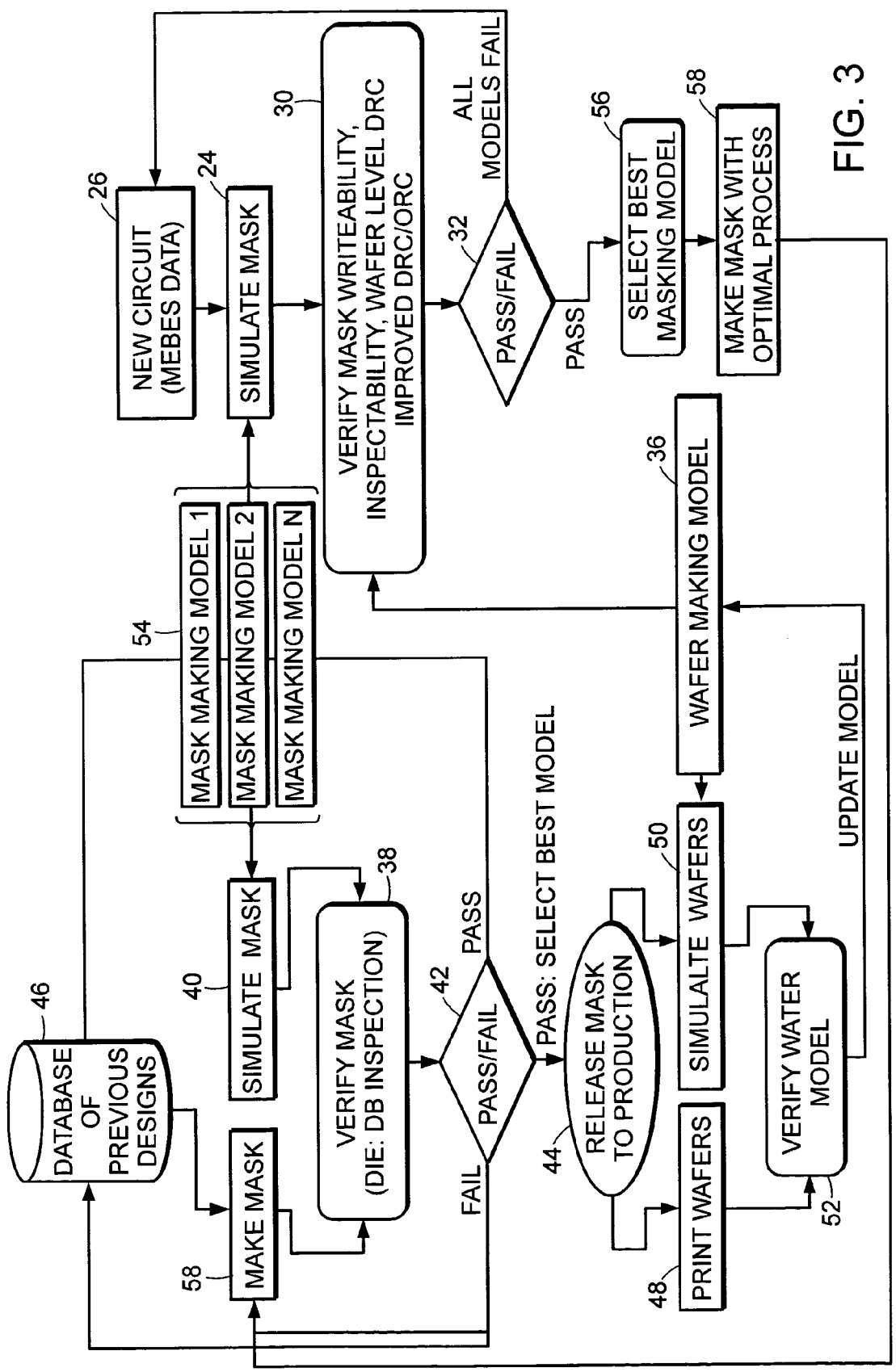

FIG. 3 illustrates another embodiment of a computer-implemented method for evaluating reticle layout data. The method shown in FIG. 3 includes several steps that are also included in the method shown in FIG. 2. Those steps that can be the same in FIGS. 2 and 3 have been indicated with the same reference numerals and will not be described again in reference to FIG. 3 for the sake of brevity. FIG. 3 also includes additional steps that are not included in the method of FIG. 2 and which are described below.

For example, as shown in FIG. 3, this method includes using multiple mask making models 54 to generate multiple simulated images 24 of reticle layout data 26. In this manner, the method may include evaluating the manufacturability, inspectability, and/or printability as described above for different reticle manufacturing processes. The multiple mask making models may be configured to simulate completely different processes or the same process but with different process parameters. The different process parameters may include, for example, the exposure dose and focus, different types of mask writing tools, different types of resist, the etch chemistry, and the like.

The multiple mask making models may be generated by altering one or more parameters of a reticle manufacturing process to generate one or more revised reticle manufacturing processes. A model may be generated for each of the revised reticle manufacturing processes. Each model may then be used to generate a simulated image corresponding to a revised reticle manufacturing process. In addition, the manufacturability, inspectability, and/or printability may be determined as described above for each of the reticle manufacturing processes.

The method may further include determining which of the one or more revised reticle manufacturing processes provides the largest improvement in, or the best, manufacturability of the reticle layout data. In one particularly advantageous embodiment, the method may include performing the simulations and evaluations with different models for each of the different reticle writing tools that are available to the user. Based on the results of this manufacturability check, the user may select the writing tool with the best tolerance for producing a defect free pattern for the given reticle design. In addition, as shown in FIG. 3, the method may include selecting the reticle manufacturing process model that produces the best manufacturability of the reticle layout data, as shown in step 56. In this manner, the best tool/process combination could be selected to manufacture each design. In some instances, the method may include determining appropriate changes to the reticle manufacturing process to create a manufacturable mask which will replicate the desired pattern at both the mask and wafer levels. The method also includes making the mask, as shown in step 58, using the reticle manufacturing process that corresponds to this model. The method shown in FIG. 3 may include any other step(s) described herein.

Figure 4:
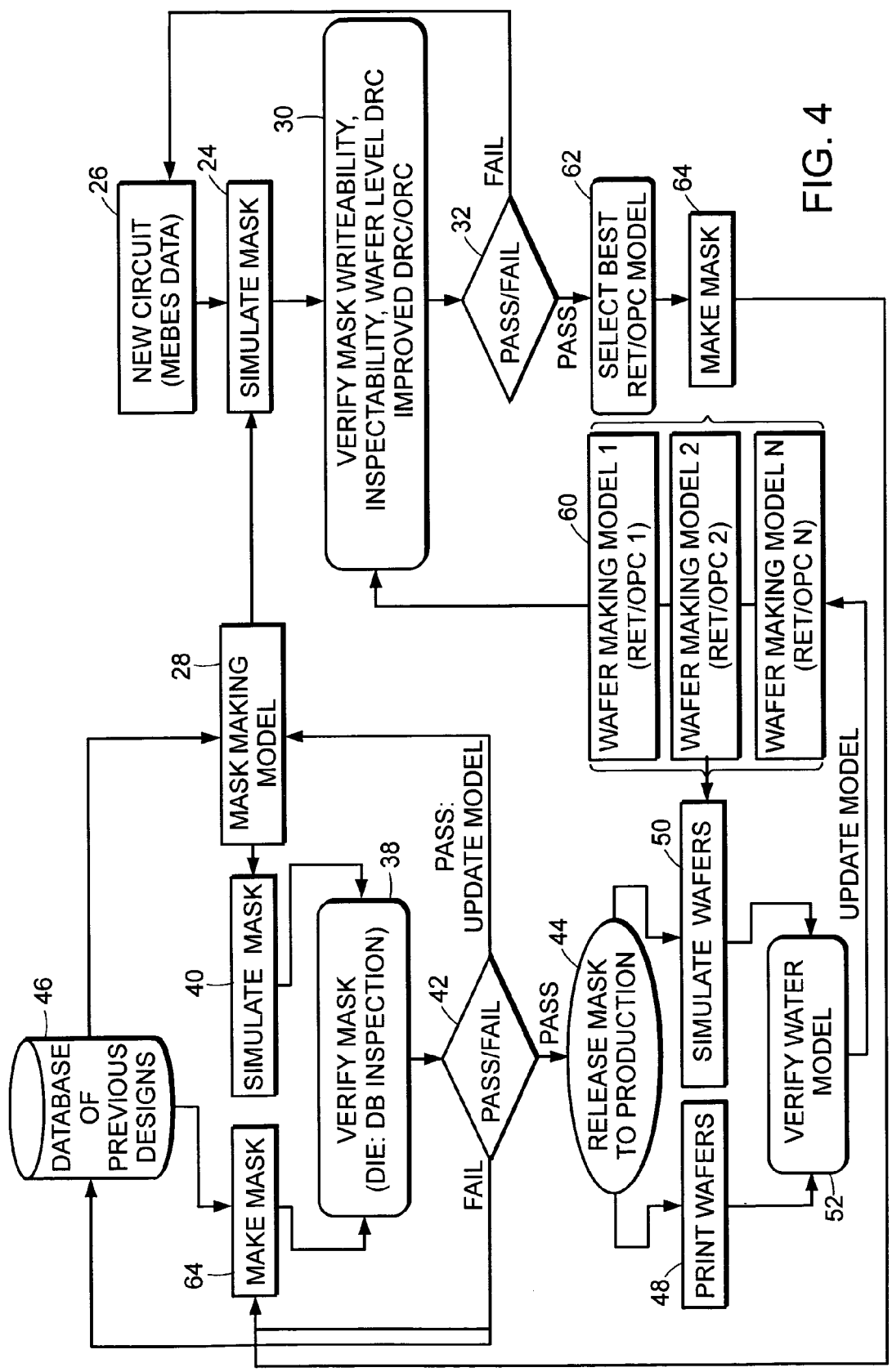

FIG. 4 illustrates another embodiment of a computer-implemented method for evaluating reticle layout data. The method shown in FIG. 4 includes several steps that are also included in the method shown in FIG. 2. Those steps that can be the same in FIGS. 2 and 4 have been indicated with the same reference numerals and will not be described again in reference to FIG. 4 for the sake of brevity. FIG. 4 also includes additional steps that are not included in the method of FIG. 2 and which are described below.

For example, FIG. 4 includes determining the manufacturability, inspectability, and/or printability for multiple wafer simulation models 60. The wafer simulation models can include different retical enhancement techniques such as different OPC features. In addition, one of the wafer simulation models may include best known focus and exposure conditions. Other wafer simulation models may include other dose/focus conditions that are expected to be within the process window. The wafer simulation models may be used for determining the printability of the reticle layout data at different process parameters. In one such embodiment, the different process parameters may include different types of lithography exposure tools and/or any other lithography process parameters known in the art.

The results of the different wafer simulation models can be used to make certain decisions about the reticle layout data and/or the wafer making process. For instance, the results may be used to determine which of the lithography exposure tools provides the best printability for the reticle layout data. In another example, the results may be used to determine the approximate process window for specific reticle layout data. In a further example, the results may be used to determine the RET features such as OPC features that will produce the best printability for the reticle layout data. In this manner, as shown in step 62, the method may include selecting the best wafer making model that produces the best printability and identifying the RET/OPC features associated with that model. These RET/OPC features may then be added to the reticle layout data that is used to fabricate the reticle. The method may include fabricating the reticle, as shown in step 64, using this reticle layout data. The reticle may be manufactured as described above. The method shown in FIG. 4 may include any other step(s) described herein.

Figure 5:
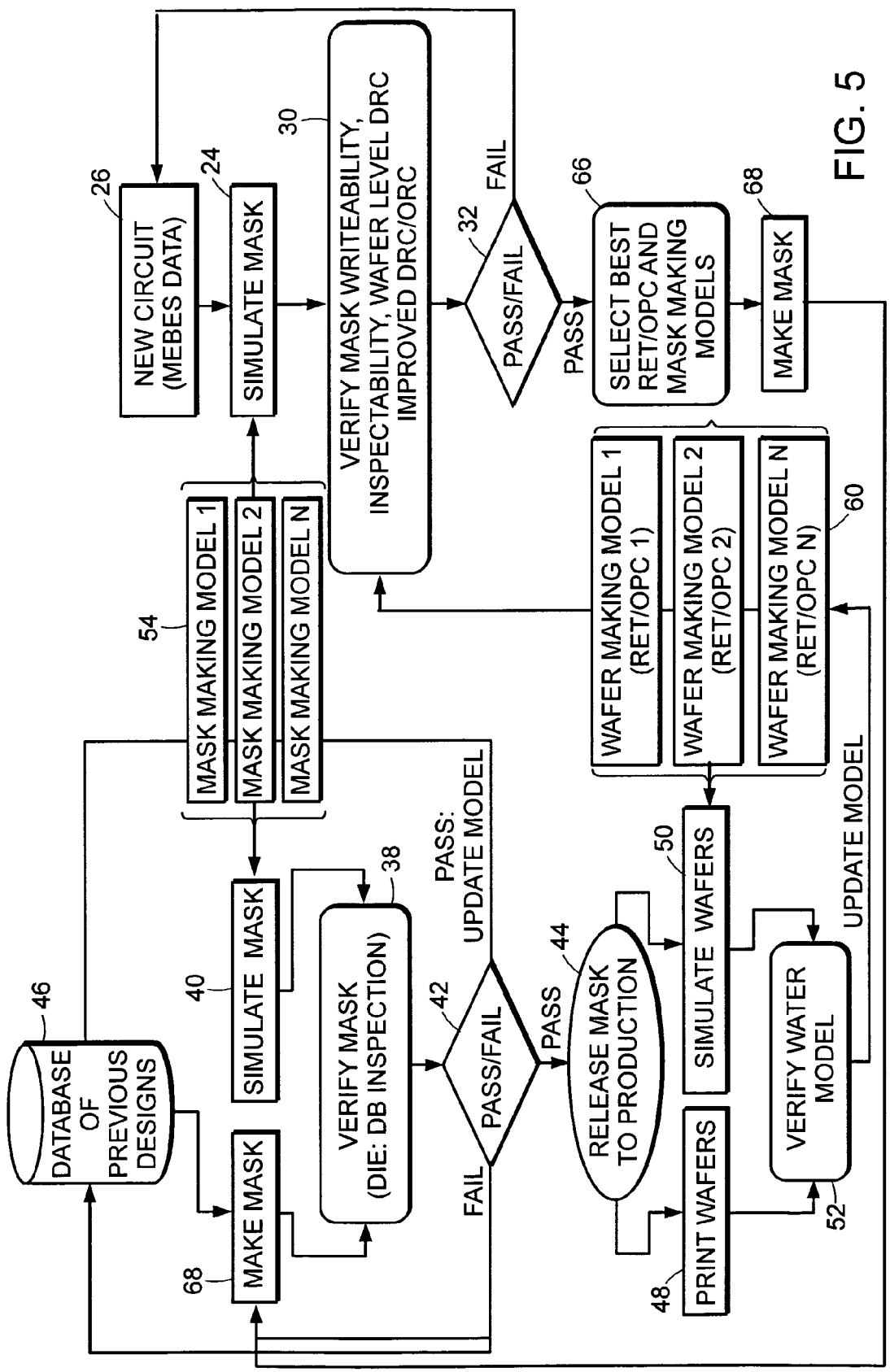

FIG. 5 illustrates yet another method for evaluating reticle layout data. The method shown in FIG. 5 is essentially a combination of the methods shown in FIGS. 3 and 4. The method shown in FIG. 5 includes several steps that are also included in the methods shown in FIGS. 3 and 4. Those steps that can be the same in these figures have been indicated with the same reference numerals and will not be described again in reference to FIG. 5 for the sake of brevity. For example, the method shown in FIG. 5 may include using multiple mask making models 54 to generate multiple simulated images 24 of reticle layout data 26, as described above. In this manner, the method may include evaluating the manufacturability, inspectability, and/or printability as described above for different reticle manufacturing processes. Each model may then be used to generate a simulated image corresponding to a revised reticle manufacturing process. In addition, as shown in FIG. 5, the method may include selecting the reticle manufacturing process model that produces the best manufacturability, inspectability, and/or printability of the reticle layout data, as shown in step 66. The method also includes making the mask, as shown in step 68, using the reticle manufacturing process model that corresponds to this selected model.

Step 66 of the method shown in FIG. 5 may also include determining the best RET/OPC features and/or wafer making model prior to manufacturing the mask. For example, the method shown in FIG. 5 may include determining the printability for multiple wafer simulation models 60 as described above. The wafer simulation models can include different retical enhancement techniques such as different OPC features as described above. The wafer simulation models may be used for determining the printability of the reticle layout data at different process parameters. In one such embodiment, the different process parameters may include different types of lithography exposure tools.

The results of the different wafer simulation models can be used to make certain decisions about the reticle layout data and/or the wafer making process. For instance, the results may be used to determine a lithography exposure tool, an approximate process window, and/or the RET features such as OPC features that will produce the best printability for the reticle layout data. In this manner, as shown in step 66, the method may include selecting the best wafer making model that produces the best printability and identifying the RET/OPC features associated with that model. The method shown in FIG. 5 may include any other step(s) described herein.

The methods described herein are, therefore, unique at least in that the concepts described herein have not been applied to the full reticle design and from mask manufacturing to wafer pattern transfer for arbitrary designs and processes. In addition, the design rule checks are moved from the reticle level to the wafer level. Furthermore, unlike other methods, the full reticle manufacturing offsets may be included in the simulations of the reticle layout data before the design rule checks are applied. Moreover, the methods described herein are unique at least in that different design rules may be used for manufacturability, inspectability, and printability analyses.

In addition, the methods described herein provide the unique advantage of linking the simulation of the mask making and wafer manufacturing processes to actual measured masks and wafers to ensure that the models are valid to within the required tolerances. Each design that is verified and approved by this process can be used to manufacture masks and wafers which can then be scanned by the appropriate tools. The data collected from the mask inspection and/or metrology tools and the wafer inspection and/or metrology tools can then be compared to the model predictions. The model can be constantly updated to ensure that it represents the most current status of both the mask and wafer processes. Monitoring techniques can be applied to identify cases in which the actual mask or wafer results fail to agree with the model predictions, and the model can be updated accordingly, or the process retuned, to restore the correct correlation between prediction and actual results.

The three types of checks described herein which are applied to the data for manufacturability, inspectability, and/or transferability to the wafer level can be performed in several ways. At the most basic level, simple rules can be written and processed on an edge by edge basis. In a more complex embodiment, models can be created of the three different process steps (reticle writing, reticle inspection, and pattern transfer to the wafer level) and the checks can be performed on modeled data. For example, in the case of reticle writing, a list of rules can be applied directly to the data files (such as GDSII data) of the OPC enhanced design, or how the data will be written can be modeled and errors can be identified by comparing the simulated data back to the decorated data file to determine if any features are missing, oversized, or distorted in an unacceptable manner. Similarly, the inspectability check can be simple runs applied to the data file, or the modeled mask could be compared to the data file using different inspection algorithms to locate faults where the inspection is unable to discern if the reticle pattern is within the specification range. At the wafer printability level, again a simple set of rules can be applied to the modeled wafer level pattern, or the modeled wafer level pattern can be compared to the modeled ideal pattern, and errors can be identified by comparing edge placement of each individual feature.

As described above, the data could also be segmented based on designer intent, and different levels of checks could be applied based on how critical a given area is to the functioning of the device. These different care regions could be evaluated with different sensitivity for all three rule checks. For example, the reticle manufacturability check could be set to allow very difficult, but not impossible, features to be included in the most electrically critical parts of the circuit, but not in less critical regions. Similarly, the inspectability checks could allow some very difficult-to-inspect patterns in some areas, but not in others. This approach could be used to minimize the number of difficult features and increase the yield of good reticles and devices.

The proposed methods and systems greatly reduce the time to fabrication of good reticles and good devices from the complete manufacturing cycle by reducing costly delays and "re-spins." A re-spin is the worst case scenario in which the reticles are made, wafers are processed, and then defects are detected at final test which render the devices unworkable. The entire design must then be reworked, new reticles made, and new wafers produced, all at great cost and with serious delays in time-to-market. The methods and systems described herein reduce excessive reticle write time trying to write unprintable images, reduce costly delays in inspection, and reduce the chance of the final chips failing to function properly due to errors in the pattern layout.

The proposed methods and systems also have several advantages in terms of design for manufacturing. For example, the system operates on the final database just prior to mask writing. Therefore, every modification of the original design, including OPC and mask process offsets, is included in the data. The methods and systems described herein can also be calibrated to reflect the actual mask process either through the use of external data (SEM images), or by sharing data with the existing calibration schemes employed by die-to-database reticle inspection tools. This approach allows the user to simulate and test how the mask will appear if it were written using different mask writing tools or processes, and the best process could be selected for each design.

For all of the process steps described herein (reticle writing, reticle inspection, and pattern transfer to the wafer level), it is also possible to create auto-correlation software which redraws the RET features so that they do pass the desired rules, thus automating the correction process. The computer-implemented methods could be implemented as software that could be operated either on a computer system or a local network of computers, or it could be operated over a remote connection such as a web based Internet connection. This mode could be especially useful for fabless semiconductor companies who send their designs out to foundries for manufacturing. By checking their design before shipping the data to the foundry, errors can be caught and corrected quickly, thereby greatly reducing the cost and cycle time of the manufacturing process.

Although the methods described herein have been described with reference to printability on the wafer, it is to be understood that the methods may also be applied to other pattern transfer processes. For example, the term "pattern transfer" can be used to indicate the wafer printing process (lithography) alone, or it could include etch, polish, and other wafer level processes which result in the final patterned structures at the wafer level. In one such example, the methods may be used to determine etch-ability of the reticle layout data by using the simulated images illustrating how the reticle layout data will be printed on a wafer as input to an etch process model. The etch process model may include any appropriate etch model known in the art. In addition, an etch process model may be created and/or updated as described herein (using experimental data).

Another method relates to a carrier medium that includes program instructions executable on a computer system for performing a method for evaluating reticle layout data. The method includes generating a simulated image using the reticle layout data as input to a model of a reticle manufacturing process. The simulated image illustrates how features of the reticle layout data will be formed on a reticle by the reticle manufacturing process. In addition, the method includes determining manufacturability of the reticle layout data using the simulated image. The manufacturability is a measure of how accurately the features will be formed on the reticle. The method may include any other step(s) described herein.

Program instructions implementing methods such as those described herein may be transmitted over or stored on a carrier medium. The carrier medium may be a transmission medium such as a wire, cable, or wireless transmission link. The carrier medium may also be a storage medium such as a read-only memory, a random access memory, a magnetic or optical disk, or a magnetic tape.

An additional embodiment relates to a system configured to evaluate reticle layout data. The system includes a computer system. The computer system includes one or more processors. In an embodiment, the computer system may be configured to execute program instructions to perform a computer-implemented method according to the above embodiments. In one particular embodiment, the system may include a computer platform with high speed processing and software, either as a standalone or a networked tool, which would accept RET enhanced design data and un-decorated design data as inputs and predict one or more of the following outputs: 1) areas in which the pattern will not be printed correctly on the reticle; 2) areas in which the reticle will be uninspectable to ensure that the pattern has been printed correctly; and 3) areas in which the pattern on the wafer will not be printed properly. The software could simply report these errors or possibly correct them in a closed loop mode.

The computer system may take various forms, including a personal computer system, mainframe computer system, workstation, network appliance, Internet appliance, or other device. In general, the term "computer system" may be broadly defined to encompass any device having one or more processors, which executes instructions from a memory medium.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

Figure 6:
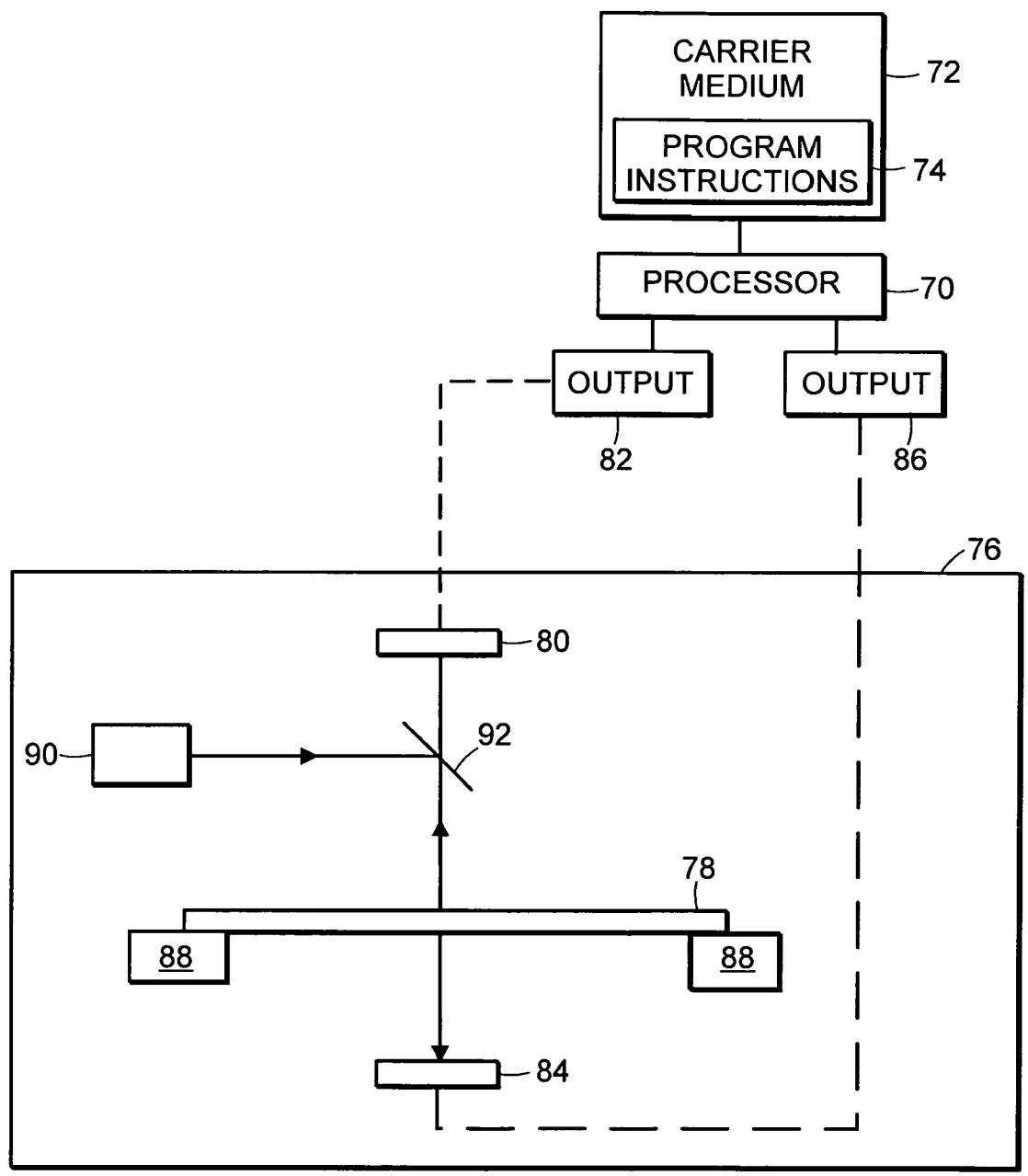
FIG. 6 is a schematic diagram illustrating a side view of one embodiment of a system that can be used to perform one or more of the computer-implemented methods described herein.

FIG. 6 illustrates one embodiment of a system that can be used to perform one or more of the methods described herein. The system includes a computer system. The computer system includes processor 70. The processor may include any suitable processor known in the art. For example, the processor may be an image computer or a parallel processor. The system may also include more than one processor. The system also includes carrier medium 72. The carrier medium may be configured as described above. For example, carrier medium 72 includes program instructions 74, which are executable on processor 70. The program instructions may be executable for performing any of the embodiments of the methods described above. The program instructions may be further configured as described above.

In some embodiments, the system may also include reticle inspection and/or metrology tool 76. Reticle inspection and/or metrology tool 76 may be configured to detect defects (not shown) on reticle 78 and/or to measure one or more characteristics of features (not shown) formed on reticle 78. Reticle inspection and/or metrology tool 76 may be coupled to processor 70. For example, one or more components of tool 76 may be coupled to processor 70 by a transmission medium (not shown). The transmission medium may include "wired" and "wireless" portions. In another example, detector 80 of tool 76 may be configured to generate output 82. The output may be transmitted across a transmission medium from detector 80 to processor 70. In addition, detector 84 of tool 76 may be configured to generate output 86, which may be transmitted across a transmission medium from detector 84 to processor 70. In some embodiments, output 82 and 86 may also be transmitted through one or more electronic components coupled between the detectors and the processor. Therefore, output 82 and 86 are transmitted from tool 76 to the processor. Output 82 and 86 may include inspection data and/or metrology data. Program instructions 74 may be executable on the processor to perform one or more of the computer-implemented methods described herein using output 82 and/or 86.

Reticle inspection and/or metrology tool 76 includes stage 88 upon which reticle 78 may be disposed during inspection and/or measurements. The stage may include any suitable mechanical or robotic assembly known in the art. Reticle inspection and/or metrology tool 76 also includes light source 90. Light source 90 may include any appropriate light source known in the art. In addition, the tool may include beam splitter 92, which is configured to direct light from light source 90 onto reticle 78 at angles that are approximately normal to an upper surface of reticle 78. The beam splitter may include any suitable beam splitter known in the art. Alternatively, the light source may be configured such that the light is directed at an oblique angle of illumination to the surface of reticle 78. Detector 80 is configured to detect light reflected from the upper surface of reticle 78 and transmitted by beam splitter 92. Detector 80 is also configured to generate output 82. Detector 84 is configured to detect light transmitted by reticle 78. Detector 84 also generates output 86. In this manner, tool 76 may be configured to detect defects on the reticle using reflected and/or transmitted light. The detectors may include any suitable detectors known in the art.

Although one general configuration of a reticle inspection and/or metrology tool is shown in FIG. 6, it is to be understood that the tool may have any suitable configuration known in the art. For example, the tool may include one of the 8250, 8250-R, or 8450 tools that are commercially available from KLA-Tencor. In addition, the tool may have various configurations such as optical imaging systems, ellipsometer-based systems, scatterometer-based systems or e-beam systems such as a CD SEM.

Furthermore, although the processor of the computer system is shown in FIG. 6 coupled to a reticle inspection and/or metrology tool, it is to be understood that the computer system may be configured as a stand alone tool in another embodiment. For example, the computer system may include one or more components that are specifically designed (and optionally dedicated) to performing one or more of the methods described herein. The computer system may also be configured to perform any other method(s) such as a method for generating an integrated circuit design.

Further modifications and alternative embodiments of various aspects of the invention may be apparent to those skilled in the art in view of this description. For example, methods, systems, and carrier media for evaluating reticle layout data are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for evaluating reticle layout data, comprising:
   using a computer system to perform steps of:
   generating a simulated image using the reticle layout data as input to a model of a reticle manufacturing process, wherein the simulated image illustrates how features of the reticle layout data will be formed on a reticle by the reticle manufacturing process;
   comparing the simulated image to the reticle layout data; and
   identifying areas in the reticle layout data in which the features will not be formed correctly on the reticle.

2. The method of claim 1, further comprising applying design rule checks to the simulated image.

3. The method of claim 1, further comprising analyzing different portions of the simulated image based on designer intent data associated with the different portions.

4. The method of claim 1, further comprising altering the reticle layout data with reticle processing biases prior to said generating.

5. The method of claim 1, wherein the model is specific to a reticle writing tool that will be used to perform the reticle manufacturing process.

6. The method of claim 1, further comprising altering the model using data measured on reticles fabricated using the reticle manufacturing process.

7. The method of claim 1, further comprising determining inspectability of the reticle layout data using the simulated image.

8. The method of claim 7, wherein said determining the inspectability comprises determining an approximate signal-to-noise ratio that data produced by inspection of the reticle will have.

9. The method of claim 7, wherein said determining the inspectability comprises determining a defect size that is the smallest that an inspection tool could detect on the reticle.

10. The method of claim 7, wherein said determining the inspectability comprises analyzing different portions of the simulated image based on designer intent data associated with the different portions.

11. The method of claim 7, further comprising performing said generating for different parameters of the reticle manufacturing process, wherein said determining the inspectability is performed for different simulated images generated with the different parameters.

12. The method of claim 11, wherein the different parameters comprise different reticle writing tools.

13. The method of claim 12, further comprising selecting one of the different reticle writing tools that could produce reticles with higher inspectability than another of the different reticle writing tools.

14. The method of claim 1, further comprising determining printability of the reticle layout data using the simulated image.

15. The method of claim 14, wherein said determining the printability comprises generating an additional simulated image that illustrates how the features of the reticle will be printed on a wafer by a lithography process.

16. The method of claim 15, wherein said determining the printability further comprises applying design rule checks to the additional simulated image.

17. The method of claim 15, wherein said determining the printability further comprises applying optical rule checks to the additional simulated image.

18. The method of claim 15, wherein said determining the printability further comprises comparing the additional simulated image to an ideal image of the features and locating errors in the additional simulated image by comparing edge placement of individual features in the additional simulated image to edge placement of corresponding features in the ideal image.

19. The method of claim 15, wherein said determining the printability further comprises analyzing different portions of the additional simulated image based on designer intent data associated with the different portions.

20. The method of claim 14, wherein said determining the printability comprises generating additional simulated images that illustrate how the features of the reticle will be printed on a wafer by a lithography process at different process parameters.

21. The method of claim 20, wherein the different process parameters comprise different types of lithography exposure tools.

22. The method of claim 14, wherein said determining the printability comprises generating an additional simulated image that illustrates how the features of the reticle will be printed on a wafer by a lithography process using the simulated image as input to a lithography process model, the method further comprising altering the lithography process model using data measured on wafers printed using the lithography process.

23. The method of claim 1, wherein the simulated image further illustrates how all of the features of the reticle layout data will be formed on the reticle.

24. The method of claim 1, wherein the reticle layout data comprises optical proximity correction feature data, aberration correction feature data, phase shift feature data, or a combination thereof.

25. The method of claim 1, further comprising altering one or more parameters of the reticle manufacturing process to generate one or more revised reticle manufacturing processes, performing said generating, said comparing, and said identifying for the one or more revised reticle manufacturing processes, and determining which of the one or more revised reticle manufacturing processes provides the largest improvement in manufacturability of the reticle layout data.

26. The method of claim 25, wherein the one or more parameters comprise different types of mask writing tools.

27. The method of claim 1, further comprising identifying defects in the reticle layout data based on said comparing.

28. The method of claim 27, further comprising allowing a user to review the defects and to alter the reticle layout data to correct the defects.

29. The method of claim 27, further comprising altering the reticle layout data to correct the defects.

30. A storage medium, comprising program instructions executable on a computer system for performing a method for evaluating reticle layout data, wherein the method comprises:
   generating a simulated image using the reticle layout data as input to a model of a reticle manufacturing process, wherein the simulated image illustrates how features of the reticle layout data will be formed on a reticle by the reticle manufacturing process;
   comparing the simulated image to the reticle layout data; and
   identifying areas in the reticle layout data in which the features will not be formed correctly on the reticle.

31. A system configured to evaluate reticle layout data, comprising:
   a computer system; and
   a storage medium comprising program instructions executable on the computer system for:
      generating a simulated image using the reticle layout data as input to a model of a reticle manufacturing process, wherein the simulated image illustrates how features of the reticle layout data will be formed on a reticle by the reticle manufacturing process;
      comparing the simulated image to the reticle layout data; and
      identifying areas in the reticle layout data in which the features will not be formed correctly on the reticle.

* * * * *